US012648464B2

(12) United States Patent
Liu et al.

(10) Patent No.: US 12,648,464 B2
(45) Date of Patent: Jun. 2, 2026

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Zi-Jheng Liu, Taoyuan City (TW); Ting-Yang Yu, Hsinchu (TW); Ming-Tan Lee, Kaohsiung City (TW); Hung-Jui Kuo, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 718 days.

(21) Appl. No.: 17/894,084

(22) Filed: Aug. 23, 2022

(65) Prior Publication Data

US 2024/0071887 A1 Feb. 29, 2024

(51) Int. Cl.
H01L 23/498 (2006.01)
H01L 21/48 (2006.01)
H01L 23/00 (2006.01)
H01L 25/16 (2023.01)

(52) U.S. Cl.
CPC .... H01L 23/49838 (2013.01); H01L 21/4857 (2013.01); H01L 21/486 (2013.01); H01L 23/49816 (2013.01); H01L 23/49822 (2013.01); H01L 23/49894 (2013.01); H01L 24/08 (2013.01); H01L 25/16 (2013.01);
(Continued)

(58) Field of Classification Search
CPC ......... H01L 23/49838; H01L 23/49816; H01L 23/49822; H01L 23/49894; H01L 24/08
See application file for complete search history.

(56) References Cited

U.S. PATENT DOCUMENTS 5,875,102 A * 2/1999 Barrow ............. H01L 23/49816
                                                        174/265
7,723,851 B2 * 5/2010 La Tulipe, Jr. ........ H10D 88/00
                                                        257/761
(Continued)

FOREIGN PATENT DOCUMENTS

TW        201906096       2/2019
TW        201916287       4/2019
(Continued)

OTHER PUBLICATIONS

"Office Action of Taiwan Counterpart Application", issued on Mar. 18, 2024, p. 1-p. 7.
(Continued)

*Primary Examiner* — Nathan W Ha
(74) *Attorney, Agent, or Firm* — JCIPRNET

(57) ABSTRACT

A semiconductor package includes a first die, a second die and a redistribution layer structure. The first die and the second die are disposed laterally. The redistribution layer structure is disposed over and electrically connected to the first die and the second die, wherein the redistribution layer structure includes a plurality of vias and a plurality of lines stacked alternately and electrically connected to each other and embedded by a plurality of polymer layers, and wherein from a top view, first vias of the plurality of vias overlapping with the first die or the second die have an elliptical-like shape.

20 Claims, 20 Drawing Sheets

100:100a,100b,100c,100d,100e
200:200a,200b,200c,200d,200e

(52) U.S. Cl.
CPC .............. *H01L 2224/08235* (2013.01); *H01L 2924/37001* (2013.01)

(56) References Cited

U.S. PATENT DOCUMENTS

| | | | | |
|---|---|---|---|---|
| 8,598,691 | B2 * | 12/2013 | Wu | H01L 24/81 |
| | | | | 257/E23.06 |
| 8,609,529 | B2 * | 12/2013 | Lin | H01L 21/3086 |
| | | | | 257/E21.549 |
| 8,993,380 | B2 | 3/2015 | Hou et al. | |
| 9,281,254 | B2 | 3/2016 | Yu et al. | |
| 9,299,649 | B2 | 3/2016 | Chiu et al. | |
| 9,372,206 | B2 | 6/2016 | Wu et al. | |
| 9,406,589 | B2 * | 8/2016 | Ting | H01L 21/76814 |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,548,281 | B2 * | 1/2017 | Yew | H01L 24/06 |
| 9,666,502 | B2 | 5/2017 | Chen et al. | |
| 9,735,131 | B2 | 8/2017 | Su et al. | |
| 9,831,120 | B2 * | 11/2017 | Lin | H01L 21/76849 |
| 10,504,865 | B2 * | 12/2019 | Liu | H01L 23/5384 |
| 11,211,316 | B1 * | 12/2021 | Huang | H01L 23/49822 |
| 2008/0217384 | A1 * | 9/2008 | Jayantha | H01L 23/49838 |
| | | | | 228/180.21 |
| 2012/0153499 | A1 * | 6/2012 | Byun | H01L 23/481 |
| | | | | 257/774 |
| 2016/0013144 | A1 * | 1/2016 | Chen | H01L 23/49838 |
| | | | | 257/774 |

| | | | | |
|---|---|---|---|---|
| 2017/0162527 | A1 * | 6/2017 | Kim | H01L 23/5226 |
| 2018/0151513 | A1 * | 5/2018 | Stone | H01L 23/481 |
| 2019/0006194 | A1 * | 1/2019 | Lin | H01L 21/56 |
| 2019/0057934 | A1 * | 2/2019 | Lin | H01L 24/19 |
| 2019/0096841 | A1 * | 3/2019 | Liu | H01L 23/5383 |
| 2019/0109015 | A1 * | 4/2019 | Lin | H01L 24/19 |
| 2020/0176272 | A1 * | 6/2020 | Raghunathan | H01L 21/768 |
| 2021/0020455 | A1 * | 1/2021 | Shih | H01L 23/5384 |
| 2021/0143092 | A1 * | 5/2021 | Goitsuka | H01L 23/49811 |
| 2021/0233826 | A1 * | 7/2021 | Park | H01L 23/3735 |
| 2021/0242172 | A1 * | 8/2021 | Wang | H01L 21/4853 |
| 2021/0287975 | A1 * | 9/2021 | Raorane | H01L 23/49838 |
| 2022/0051959 | A1 * | 2/2022 | Lee | H01L 21/76802 |
| 2022/0148954 | A1 * | 5/2022 | Huang | H01L 23/5384 |
| 2022/0199427 | A1 * | 6/2022 | Fadayomi | H01L 23/49822 |
| 2022/0310503 | A1 * | 9/2022 | Hsu | H01L 24/16 |
| 2022/0367400 | A1 * | 11/2022 | Li | H01L 23/5386 |
| 2023/0131240 | A1 * | 4/2023 | Ko | H01L 23/5386 |
| | | | | 257/690 |
| 2024/0006292 | A1 * | 1/2024 | Strong | H01L 23/49822 |

FOREIGN PATENT DOCUMENTS

| | | |
|---|---|---|
| TW | 202008545 | 2/2020 |
| TW | 202107644 | 2/2021 |
| TW | 202121943 | 6/2021 |

OTHER PUBLICATIONS

"Office Action of Taiwan Counterpart Application", issued on Oct. 31, 2023, p. 1-p. 11.

* cited by examiner

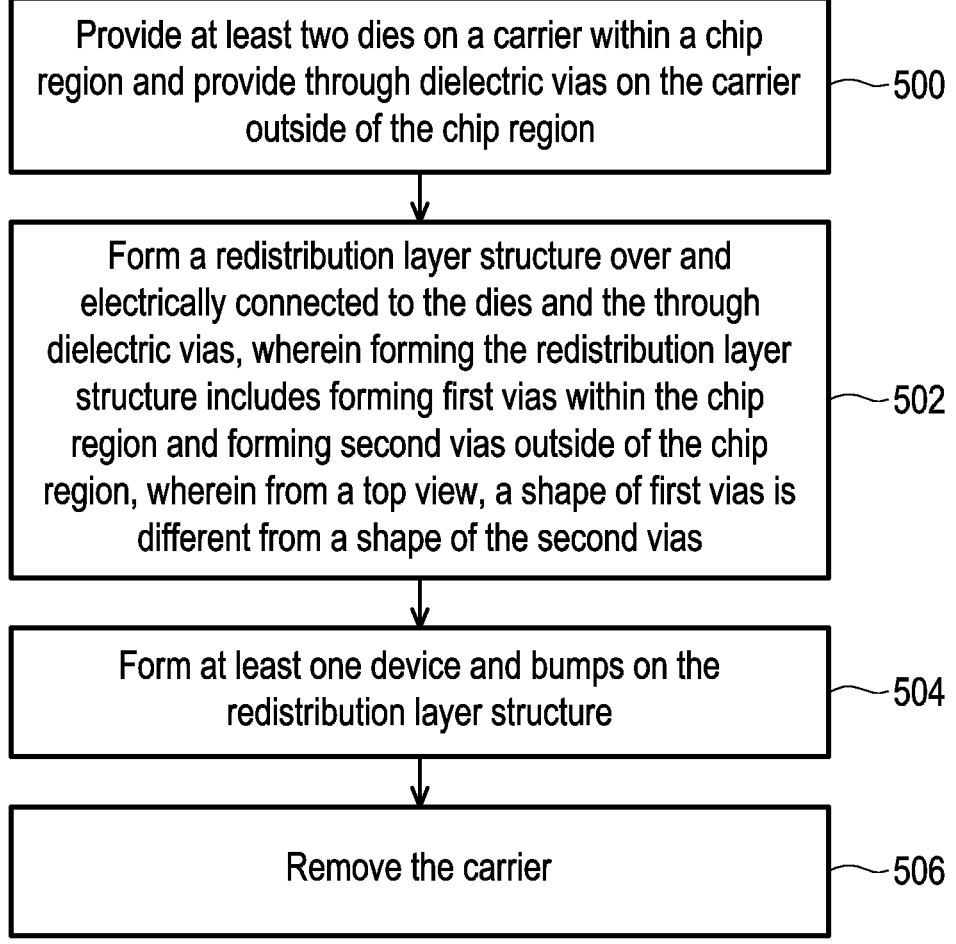

Provide at least two dies on a carrier within a chip region and provide through dielectric vias on the carrier outside of the chip region ⎯500

Form a redistribution layer structure over and electrically connected to the dies and the through dielectric vias, wherein forming the redistribution layer structure includes forming first vias within the chip region and forming second vias outside of the chip region, wherein from a top view, a shape of first vias is different from a shape of the second vias ⎯502

Form at least one device and bumps on the redistribution layer structure ⎯504

Remove the carrier ⎯506

FIG. 21

SEMICONDUCTOR PACKAGE AND MANUFACTURING METHOD THEREOF

BACKGROUND

The semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Although the existing semiconductor packages have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 to FIG. 7 are simplified enlarged top views illustrating a method of forming a portion of the structure of FIG. 4 according to some embodiments of the present disclosure.

FIG. 21 is a flow chart showing a method of forming a semiconductor package according to some embodiments of the present disclosure.

DETAILED DESCRIPTION

Figure 1:
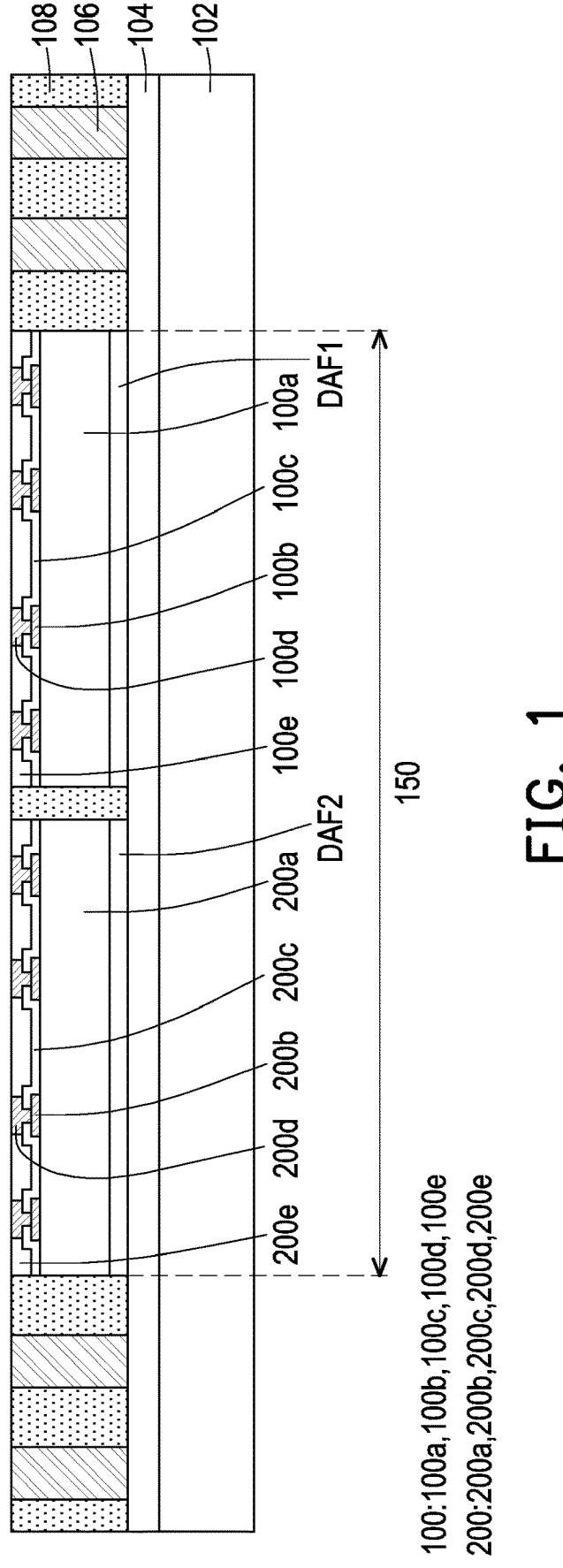
FIG. 1 to FIG. 4 are schematic cross sectional views illustrating a method of forming a semiconductor package according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In a semiconductor package, redistribution layers are included for routing and interconnecting dies and/or semiconductor devices. The present disclosure provides a redistribution layer structure with an ultra-fine pitch. In some embodiments, with the arrangement of the elongated vias of the disclosure, the pitch of the routing lines of a redistribution layer can be significantly reduced by more than 50%.

FIG. 1 to FIG. 4 are schematic cross sectional views illustrating a method of forming a semiconductor package according to some embodiments of the present disclosure. It is understood that the disclosure is not limited by the method described below. Additional operations can be provided before, during, and/or after the method and some of the operations described below can be replaced or eliminated, for additional embodiments of the methods.

Referring to FIG. 1, at least two dies 100 and 200 and multiple through dielectric vias (TIVs) 106 are provided on a carrier 102. In some embodiments, the carrier 102 is provided with a debond layer 104 coated thereon, and the material of the debond layer may be any material suitable for debonding the carrier 102 from the above dies disposed thereon. In some embodiments, the carrier 102 is a non-semiconductor material, such as a glass carrier, a ceramic carrier, or the like. In some embodiments, the debond layer 104 includes an Ultra-Violet (UV) glue, a Light-to-Heat Conversion (LTHC) glue, or the like, although other types of adhesives may be used. The debond layer 104 is decomposable under the heat of light to thereby release the carrier 102 from the structure formed thereon.

In some embodiments, through dielectric vias (TIVs) 106 are formed on the carrier 102. In some embodiments, the TIVs 106 are through integrated fan-out (InFO) vias. In some embodiments, the TIVs 106 include copper, nickel, titanium, the like, or a combination thereof, and are formed by photolithography, plating, and photoresist stripping processes.

In some embodiments, dies 100 and 200 are provided and placed over the carrier 102. In some embodiments, a die attach film DAF1 is provided between the debond layer 104 and the die 100 and a die attach film DAF2 is provided between the debond layer 104 and the die 200, for better adhering the dies 100 and 200 to the debond layer 104 of the carrier 102.

In some embodiments, the dies 100 and 200 may include different types of dies or the same types of dies. In some embodiments, the dies 100 and 200 may include one or more types of chips selected from application-specific integrated circuit (ASIC) chips, analog chips, sensor chips, wireless and radio frequency chips, voltage regulator chips or memory chips. The dies and chips may be used interchangeably through the specification.

In some embodiments, the die 100 includes a substrate 100a, pads 100b, a passivation layer 100c, die connectors 100d and an optional protection layer 100e. The substrate 100a includes, for example but not limited to, bulk silicon, doped or undoped, or an active layer of a semiconductor-on-insulator (SOI) substrate. The substrate 100a has a device layer including at least one transistor and an interconnection layer. The pads 100b are formed over the substrate 100a, and the passivation layer 100c is formed over the pads 100b. In some embodiments, the pads 100b are aluminum pads, and the passivation layer 100c includes a polymer material such as polybenzoxazole (PBO), polyimide, benzocyclobutene (BCB), the like, or a combination thereof. The die connectors 100d are formed through the passivation layer 100c and electrically connected to underlying pads 100b or an interconnection structure. In some embodiments, the die connectors 100d are formed as the top portions of the die 100. The die connectors 100d protrude from the remaining portions or lower portions of the die 100. Throughout the description, the side of the die 100 with the die connectors 100d are referred to as a front side or an active side. The die connectors 100d may include Cu, W, Ni, Sn, Ti, Au, an alloy or a combination thereof, and are formed with an electroplating process. The die connectors 100d may have a circle-like shape from a top view. In some embodiments, the protection layer 100e includes polybenzoxazole (PBO), polyimide (PI), a suitable organic or inorganic material or the like. In some embodiments, the protection layer 100e may be optional and omitted from the die 100.

In some embodiments, the die 200 includes a substrate 200a, pads 200b, a passivation layer 200c, die connectors 200d and an optional protection layer 200e. The materials and arrangements of these elements of the die 200 are similar to those of the die 100, so the details are not iterated herein. In some embodiments, the dies 100 and 200 are designed to have the same size (top area and/or height) and function. In other embodiments, the dies 100 and 200 are designed to have different sizes (top areas and/or heights) and functions as needed.

In some embodiments, the TIVs 106 are formed on the carrier 102 before the dies 100 and 200 are picked and placed on the carrier 102. In other embodiments, the TIVs 106 are formed on the carrier 102 after the dies 100 and 200 are picked and placed on the carrier 102.

In one embodiment, the dies 100 and 200 are provided and bonded to the carrier 102 with the active surface facing upward (as seen in FIG. 1). In certain embodiment, the TIVs 106 are arranged along the periphery of the dies 100 and 200. However, depending on product design, some of the TIVs 106 may be arranged at locations other than the periphery of the dies 100 and 200. In some embodiments, in addition to the dies 100 and 200 placed over the carrier 102 side-by-side as shown in FIG. 1, another die is further included and placed vertically or laterally aside the dies 100 and 200. The number of the dies arranged side-by-side or vertically stacked over another die(s) may be adjusted or modified based on the product design but are not limited by the present disclosure.

Still referring to FIG. 1, in some embodiments, the dies 100 and 200 and the TIVs 106 located over the carrier 102 are molded and encapsulated in a dielectric encapsulation layer 108. In one embodiment, the dielectric encapsulation layer 108 is formed around the dies 100 and 200 and the TIVs 106. In one embodiment, the dielectric encapsulation layer 108 includes a molding compound such as epoxy, a photo-sensitive material such as polybenzoxazole (PBO), polyimide (PI) or benzocyclobutene (BCB), a combination thereof or the like. The method of forming the dielectric encapsulation layer 108 includes forming an encapsulant material layer (not shown) on the carrier 102 covering the dies 100 and 200 and the TIVs 106, and performing a grinding process to partially remove the encapsulant material layer until the top surfaces of the TIVs 106 and the die connectors 100d and 200d are exposed. In some embodiments, when the protection layers 100e and 200e are omitted, the dielectric encapsulation layer 108 is in contact with the die connectors 100d and 200d.

Figure 2:
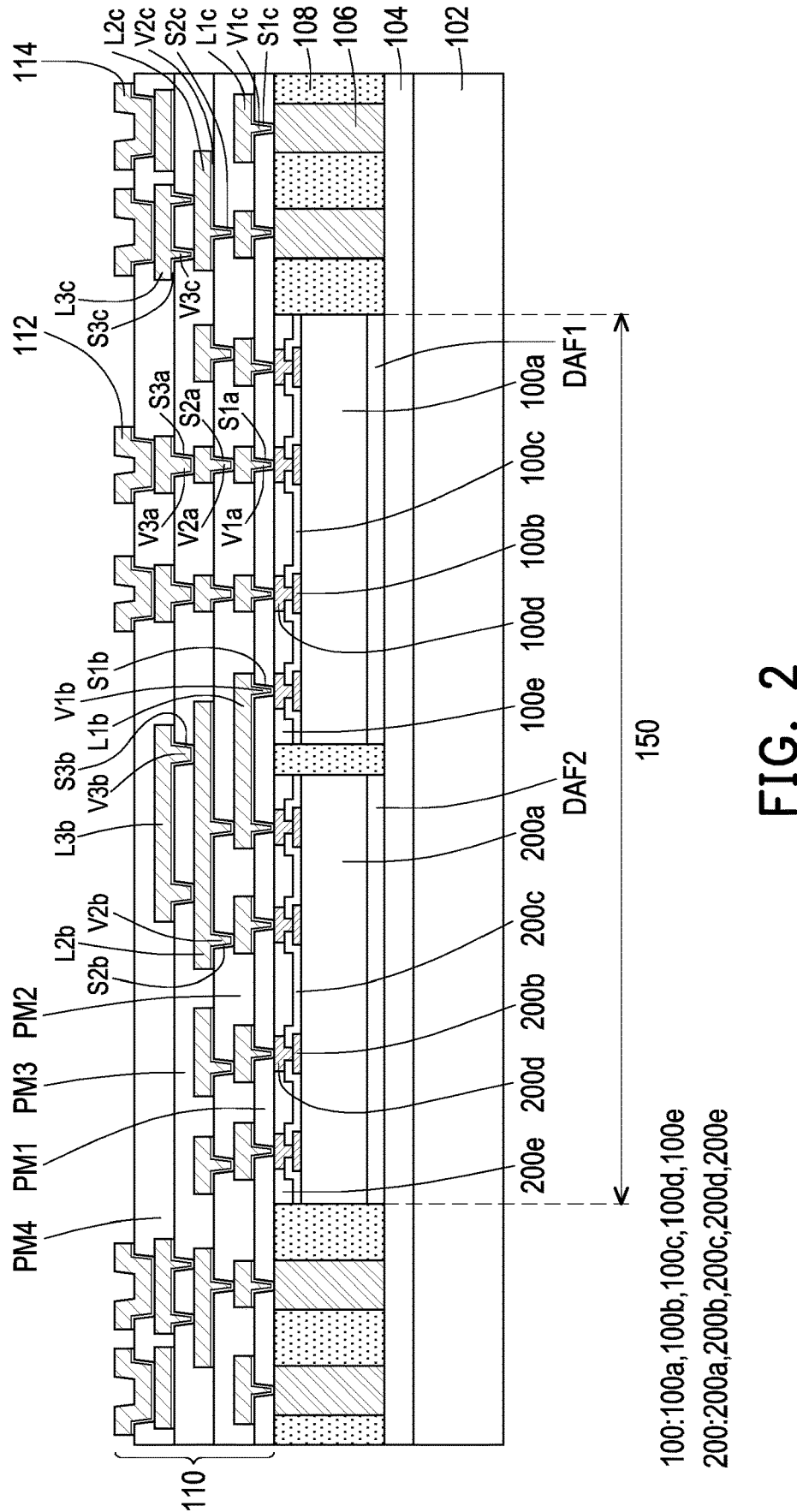

Referring to FIG. 2, a redistribution layer structure 110 is formed on the dielectric encapsulation layer 108, over the TIVs 106 and on the dies 100 and 200. In some embodiment, the redistribution layer structure 110 is electrically connected to the TIVs 106 and the dies 100 and 200. The formation of the redistribution layer structure 110 includes sequentially forming more than one polymer material layers and more than one metallization layers in alternation.

The redistribution layer structure 110 may include metal features embedded by polymer layers. The metal features are disposed in the polymer layers and electrically connected with each other. The polymer layers may include a photo-sensitive material such as polybenzoxazole (PBO), polyimide (PI), benzocyclobutene (BCB), the like, or a combination thereof. The polymer layers of the redistribution layer structure 110 may be replaced by dielectric layers or insulating layers as needed. The metal features include metal lines, metal vias and/or metal pads. The metal vias are formed between and in contact with two metal lines. The metal features may include Cu, Al, Ti, Ta, W, Ru, Co, Ni, the like, or a combination thereof. In some embodiments, a metal liner layer may be disposed between each metal feature and the polymer layer. In some embodiments, the metal liner layer includes a seed layer and/or a barrier layer. The seed layer may include Ti/Cu. The barrier layer may include Ta, TaN, Ti, TiN, CoW or a combination thereof. In some embodiments, the redistribution layer structure 110 is formed by a dual damascene process. For example, a metal line and the underlying metal via may be formed as an integrated line and via structure without an interface by a dual damascene process.

For example, metal features (lines L1b/L1c and vias V1b/V1c) are formed by lining via openings of a polymer layer PM1 with a seed layer, forming a photoresist layer with line openings on the seed layer, plating the metal features (lines L1b/L1c and vias V1b/V1c) from the seed layer, and removing the photoresist layer and the underlying the seed layer. Seed layers S1b/S1c are provided between the metal features (lines L1b/L1c and vias V1b/V1c) and the polymer layer PM1. In curtain embodiment, the via openings of the polymer layer PM1 are controlled properly (e.g., less than about 10 um or 5 um), so the formed vias V1a may have planar top surfaces for the landing of the overlying vias V2a.

A seed layer Sla is provided between the via V1a and the polymer layer PM1. A polymer layer PM2 is then formed on the polymer layer PM1.

Thereafter, metal features (lines L2b/L2c and vias V2b/V2c) are formed by lining via openings of the polymer layer PM2 with a seed layer, forming a photoresist layer with line openings on the seed layer, plating the metal features (lines L2b/L2c and vias V2b/V2c) from the seed layer, and removing the photoresist layer and the underlying the seed layer. Seed layers S2b/S2c are provided between the metal features (lines L2b/L2c and vias V2b/V2c) and the polymer layer PM2. In curtain embodiment, the via openings of the polymer layer PM2 are controlled properly (e.g., less than about 10 um or 5 um), so the formed vias V2a may have planar top surfaces for the landing of the overlying vias V3a. A seed layer S2a is provided between the via V2a and the polymer layer PM2. A polymer layer PM3 is then formed on the polymer layer PM2.

Afterwards, metal features (lines L3b/L2c and vias V3b/V3c) are formed by lining via openings of the polymer layer PM3 with a seed layer, forming a photoresist layer with line openings on the seed layer, plating the metal features (lines L3b/L3c and vias V3b/V3c) from the seed layer, and removing the photoresist layer and the underlying the seed layer. Seed layers S3b/S3c are provided between the metal features (lines L3b/L3c and vias V3b/V3c) and the polymer layer PM3. In curtain embodiment, the via openings of the polymer layer PM3 are controlled properly (e.g., less than about 10 um or 5 um), so the formed vias V3a may have planar top surfaces for the landing of the overlying pads. A seed layer S3a is provided between the via V3a and the polymer layer PM3. A polymer layer PM4 is then formed on the polymer layer PM3.

In some embodiments, the vias V3a are vertically aligned to (directly over) the underlying vias V2a, and the vias V2a are vertically aligned to (directly over) the underlying vias V2a. Such stacking vias provide two advantageous features. Firstly, vias are vertically stacked, and the chip area is saved. Metal lines or routing lines may be placed closer to each other. Secondly, by stacking vias, the signal paths can be shortened, and hence the side effects such as the parasitic capacitance caused by lengthened signal paths can be reduced. This is especially beneficial for high-frequency signals.

In the present disclosure, some vias (e.g., V1a/V2a, V1b/V2b) within the chip region 150 have a shape different from some vias (e.g., V1c/V2c) outside of the chip region 150. For examples, from a top view, the vias (e.g., V1a/V2a, V1b/V2b) within the chip region 150 have an elliptical-like shape, while the vias (V1c/V2c/V3c) outside of the chip region 150 have a circle-like shape. The shape difference will be described below with reference to FIG. 5 to FIG. 13. The elliptical-like vias directly above two dies are elongated towards each other, so as to greatly improve the die-to-die interconnection or talk between the facing dies and therefore significantly reduce the line pitch of the metal routing lines.

Figure 3:
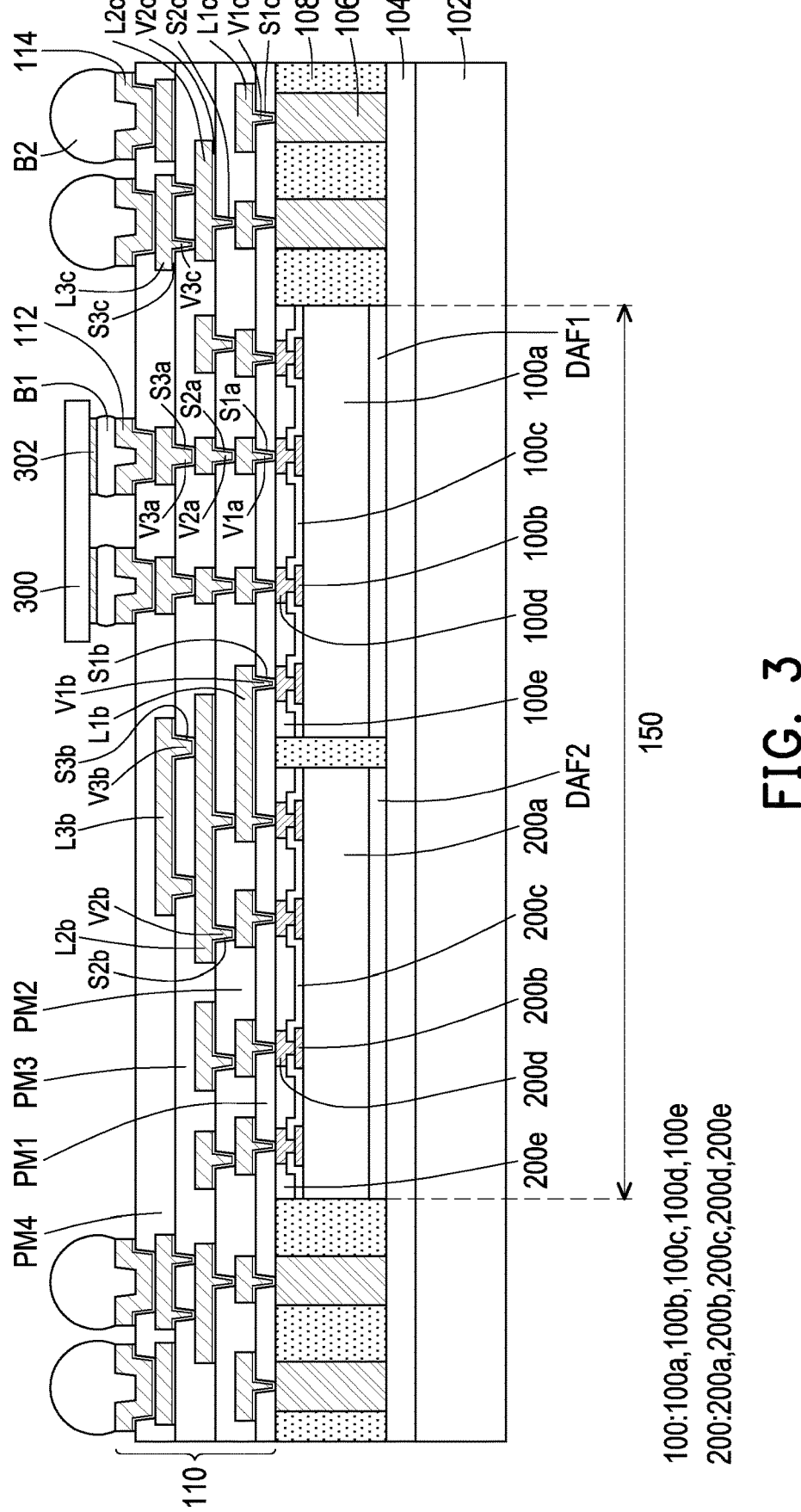

Still referring to FIG. 3, connection pads 112 and underball metallurgy (UBM) pads 114 are formed through the polymer layer PM4 and electrically connected to the underlying metal feature (vias V3a and lines L3c) of the redistribution layer structure 110. In some embodiments, the connection pads 112 and the UBM pads 114 are regarded as part of the redistribution layer structure 110. In some embodiments, the UBM pads 114 surround the connection pads 112, and the dimension of the UBM pads 114 is greater than the dimension of the connection pads 112. In some embodiments, the connection pads 112 and the UBM pads 114 include copper, nickel, titanium, a combination thereof or the like, and are formed by an electroplating process.

Referring to FIG. 3, at least one die or device 300 with connection pads 302 is bonded to the connection pads 112 through micro-bumps B1, and conductive elements or bumps B2 are placed on and electrically connected to the UBM pads 114. In some embodiments, the device 300 are bonded to the connection pads 112 with the front side thereof facing the front-side redistribution layer structure 110. In some embodiments, the device 300 is an integrated passive device (IPD) including resistors, capacitors, inductors, resonators, filters, and/or the like. In other embodiments, the second chip 200 can be an integrated active device (IAD) upon the process requirements. In some embodiments, the micro-bumps B1 and bumps B2 may be solder bumps, and/or may include metal pillars (e.g., copper pillars), solder caps formed on metal pillars, and/or the like. When solder is used, the solder may include either eutectic solder or non-eutectic solder. The solder may include lead or be lead-free, and may include Sn—Ag, Sn—Cu, Sn—Ag—Cu, or the like. The micro-bumps B1 and bumps B2 may be formed respectively by a suitable process such as evaporation, electroplating, ball drop, or screen printing.

Figure 4:
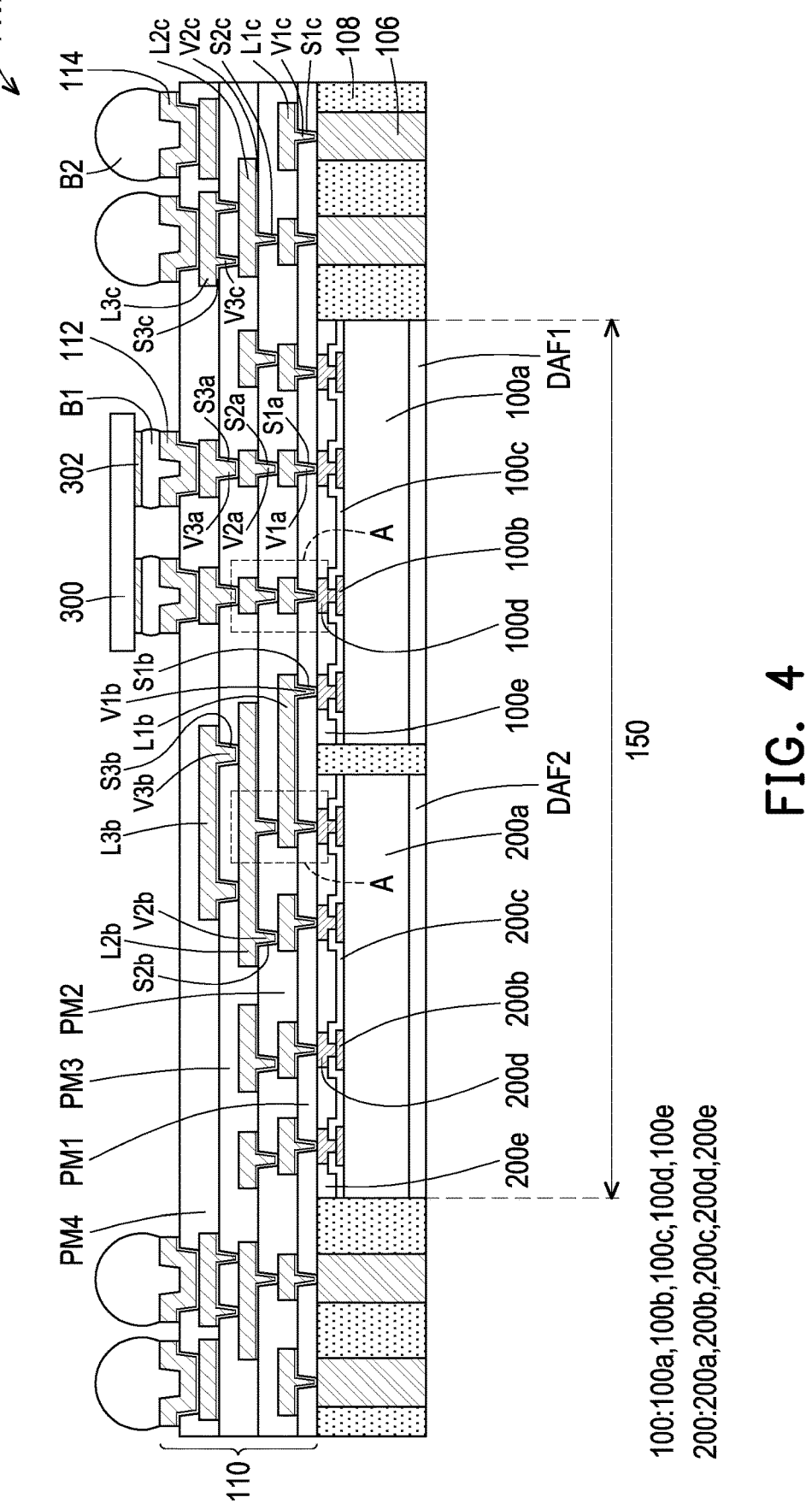

Referring to FIG. 4, the carrier 102 is removed. The carrier 102 is de-bonded from the backside of the structure of FIG. 3. In some embodiments, the de-bonding layer 104 is decomposed under heat of light, and the carrier 102 is then released from the structure formed thereon. A semiconductor package PK1 of some embodiments is thus completed.

Figure 5:
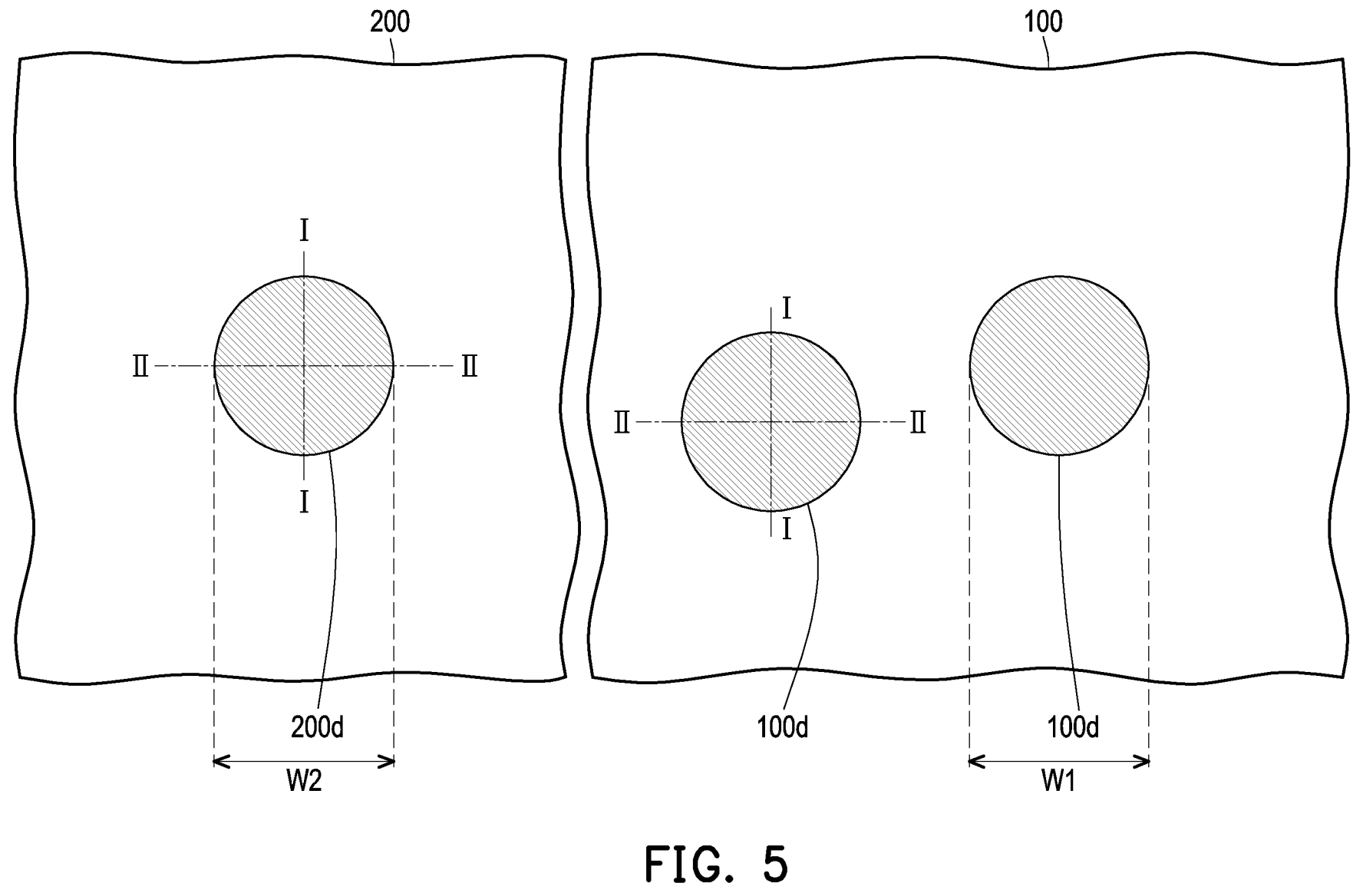
Figure 6:
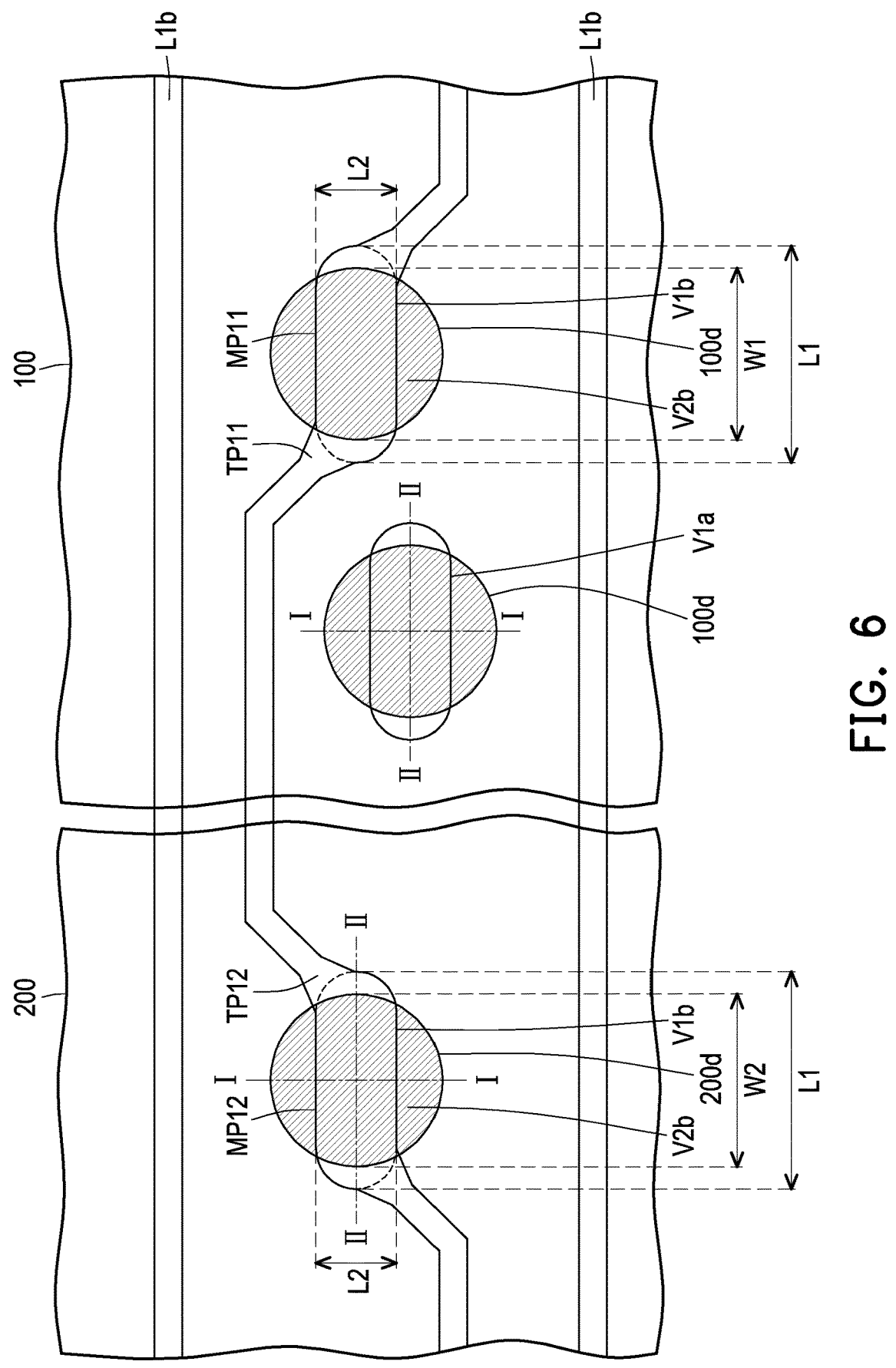
Figure 7:
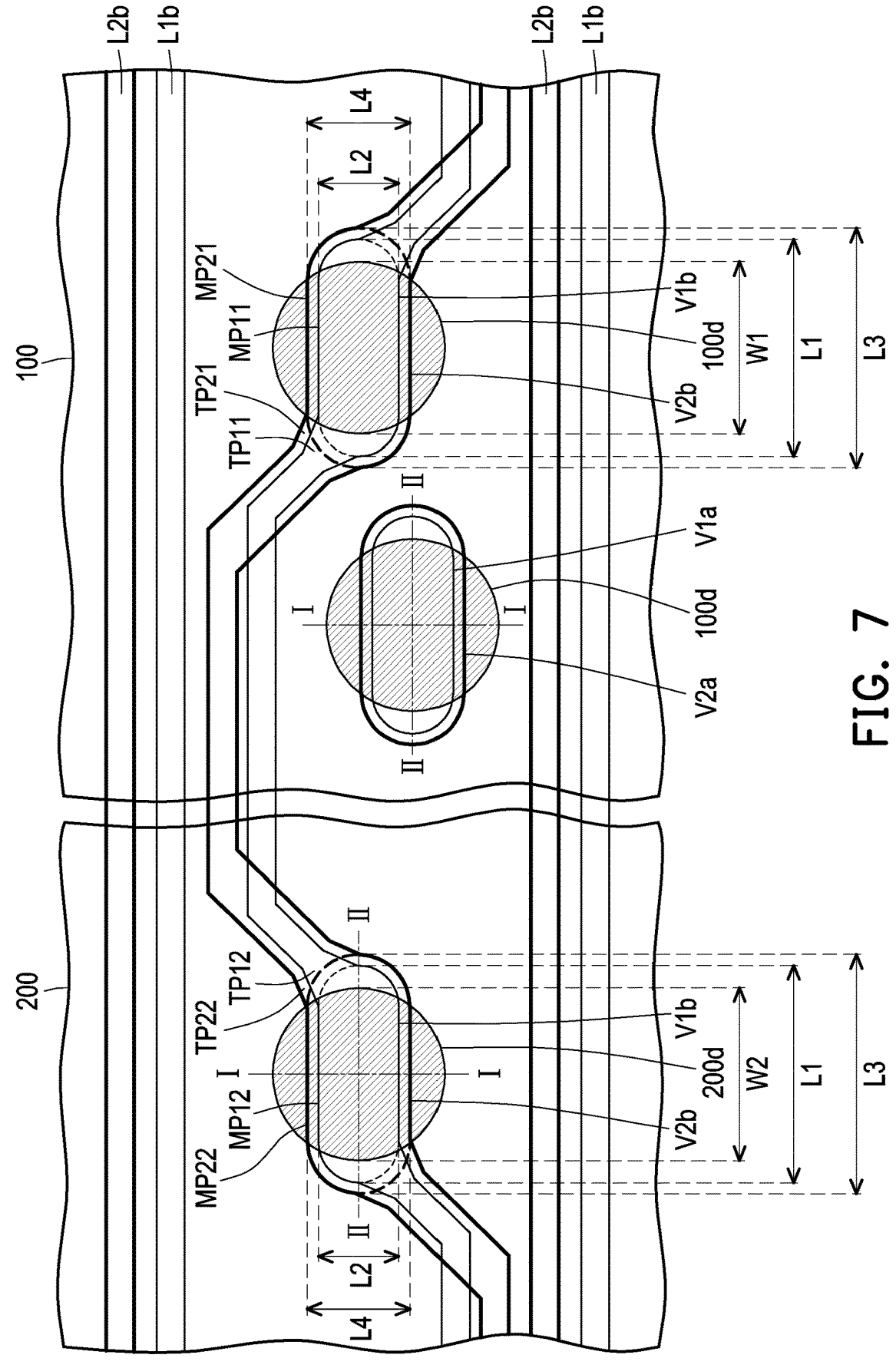

FIG. 5 to FIG. 7 are simplified enlarged top views illustrating a method of forming a portion A of the structure of FIG. 4 according to some embodiments of the present disclosure. For simplicity and clarity, only few die connectors of dies and few vias and lines of the redistribution layer structure are shown. FIG. 8 to FIG. 13 are schematic cross sectional views illustrating a method of forming a portion A of the structure of FIG. 4 respectively taken along the lines I-I and II-II according to some embodiments of the present disclosure.

Figure 8:
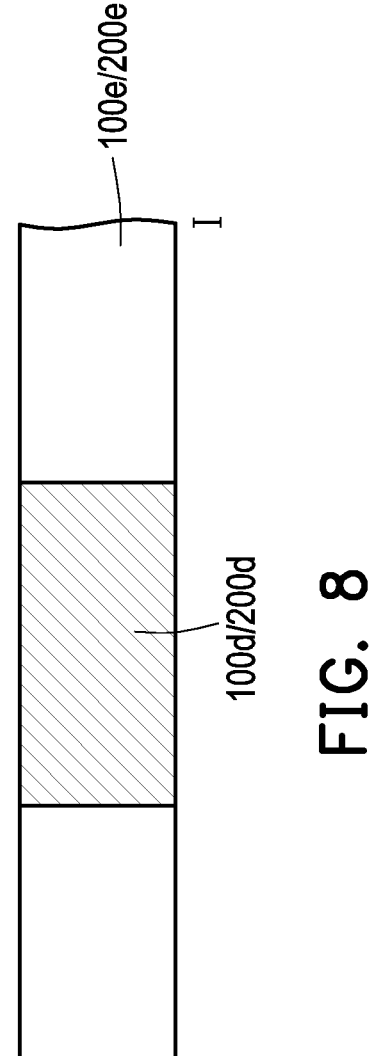
FIG. 8 to FIG. 13 are schematic cross sectional views illustrating a method of forming a portion of the structure of FIG. 4 respectively taken along the lines I-I and II-II according to some embodiments of the present disclosure.
Figure 9:
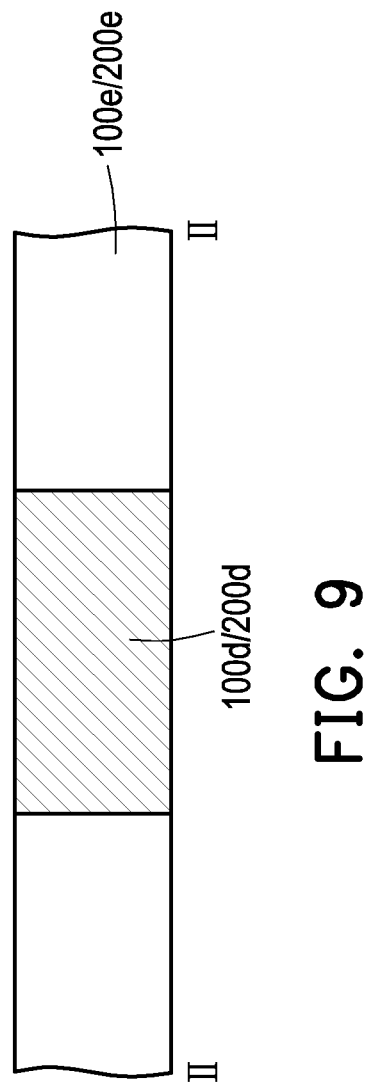

Referring to FIG. 5 and FIG. 8 to FIG. 9, dies 100 and 200 with die connectors 100d and 200d are provided, and passivation layers 100e and 200e are provided around the die connectors 100d, respectively. From a top view, the die connectors 100d and 200d have a circle-like shape and have diameters W1 and W2, respectively. The cross section views of FIG. 8 and FIG. 9 taken along the lines I-I and II-II of FIG. 5 are similar due to the shapes of the connectors 100d and 200d are circle-like. The sizes or dimensions (e.g., diameters W1 and W2) of the die connectors 100d and 200d may be the same or different.

Figure 10:
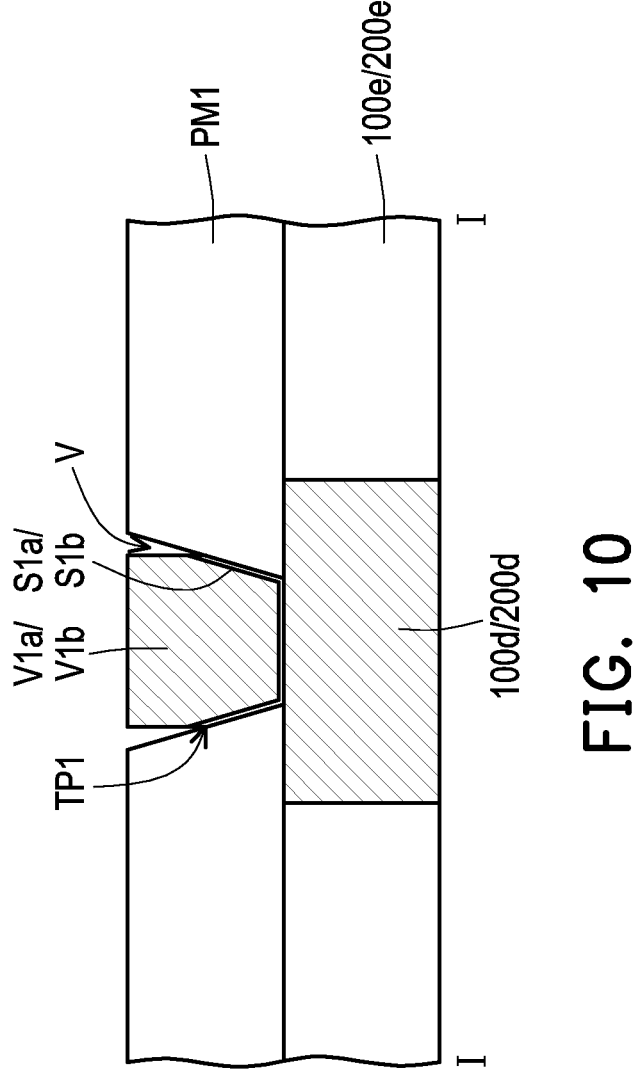
Figure 11:
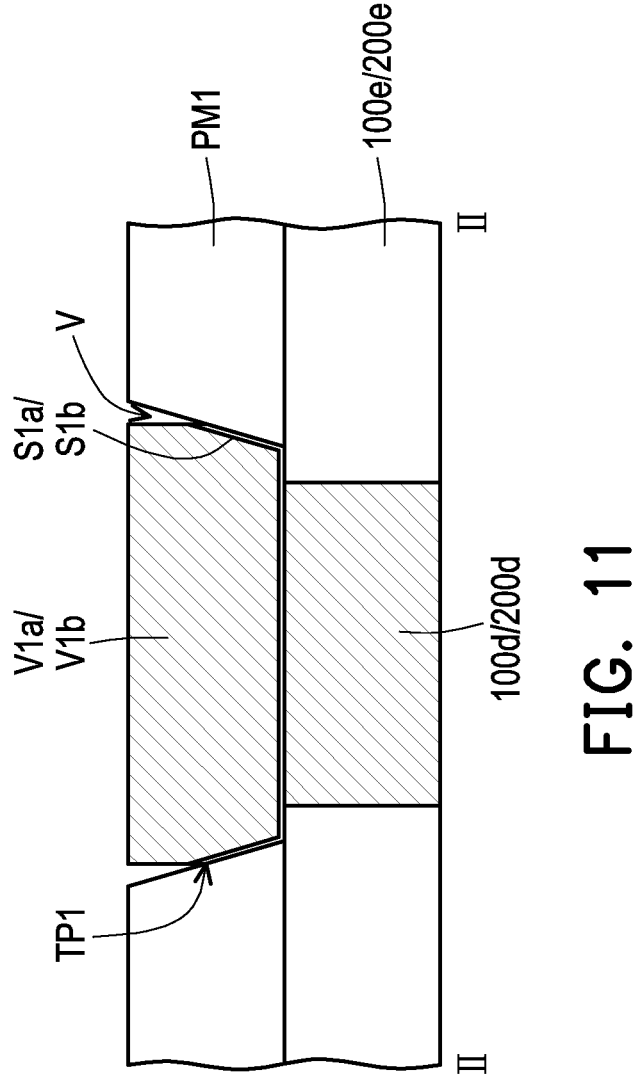

Referring to FIG. 6 and FIG. 10 to FIG. 11, elliptical-like vias V1a/V1b are formed above the die connectors 100d/200d. As shown in the top view of FIG. 6, the vias V1a/V1b have a first length L1 at a semi-major axis and a second length L2 at a semi-minor axis, the first length L1 is greater than the second length L2, and the semi-major axis of the vias V1a/V1b extends along a direction from one die of the dies 100 and 200 towards the facing die of the dies 100 and 200. In some embodiments, the first length L1 of the vias V1a/V1b is greater than the diameter W1/W2 of the die connectors 100d/200d, and the second length L2 of the vias V1a/V1b is smaller than the diameter W1/W2 of the die connectors 100d/200d. However, the present disclosure is not limited thereto. In other embodiments, at least one of the first length L1 and the second length L1 of the vias V1a/V1b is no more than (e.g., equal to or less than) the W1/W2 of the die connectors 100d/200d. In some embodiments, the via V1a is part of stacking vias, so a routing line may not be necessary to provide on the via V1a. In some embodiments, the vias V1b are part of the die-to-die interconnection, so a line L1b is provided on the vias V1b for the die-to-die interconnection. In some embodiments, the via V1b on the corresponding die connector 100d has a main part MP11 and at least one tapered part TP11 protruding outward and tapering from the main part MP11 to the routing trace or the line L1b. In some embodiments, the via V1b on the corresponding die connector 200d has a main part MP12 and at least one tapered part TP12 protruding outward and tapering from the main part MP12 to the routing trace or the line L1b. The tapered part is referred to as a "neck portion" or "beak portion" in some examples. The via V1b having a main part MP11/MP12 and a tapered part TP11/TP12 is referred to as a "via cap" or "RDL cap" in some examples.

The cross section views of FIG. 10 and FIG. 11 taken along the lines I-I and II-II of FIG. 6 are different due to the shapes of the vias V1a/V1b are elliptical-like. In one cross section as shown in FIG. 10, the bottom width of the vias V1a/V1b is less than the diameter W1/W2 of the die connectors 100d/200d. In another cross section as shown in FIG. 11, the bottom width of the vias V1a/V1b is greater than the diameter W1/W2 of the die connectors 100d/200d, and is in contact with the protection layers 100e/200e. The sizes or dimensions (e.g., first or second lengths) of the vias V1a/V1b on each of the dies 100 and 200 may be the same or different.

The method of forming the vias V1a/V1b includes the following operations. A seed layer is conformally formed on the top surface of the polymer layer PM1 and on the sidewall and bottom of the opening in the polymer layer PM1. In some embodiments, for fine-pitch purpose, a photoresist layer (not shown) with a line opening is formed on the seed layer, and the line opening exposes the lower portion of the opening while covers the upper portion of the opening in the polymer layer PM1. The vias V1a/V1b and the lines L1b (not shown in this cross section) are plated from the seed layer. The photoresist layer and the underlying seed layer are removed. The remaining seed layer S1a/S1b is provided between the corresponding via V1a/V1b and the polymer layer PM1. In certain embodiment, the top surface of the via V1a/V1b may be substantially flushed with the top surface of the polymer layer PM1, and voids V may be present between the via V1a/V1b and the polymer layer PM1, as shown in FIG. 10 and FIG. 11. From another point of view, the sidewall of the via V1a/V1b may have a turning point TP1, as shown in FIG. 10 and FIG. 11. However, the present disclosure is not limited thereto. In some embodiments, the via V1a/V1b completely fills the opening of the polymer layer PM1, without leaving a void between the sidewall of the via V1a/V1b and the polymer layer PM1, and the top surface of the via V1a/V1b is flushed with or slightly higher than the top surface of the polymer layer PM1.

In other embodiments, when the footprint area is still enough, the photoresist layer may be formed to expose the entire opening of the polymer layer PM1, so the top surface of the formed via V1a/V1b may be higher than the top surface of the polymer layer PM1 and may partially cover the top surface of the polymer layer PM1, as shown in FIG. 4.

Figure 12:
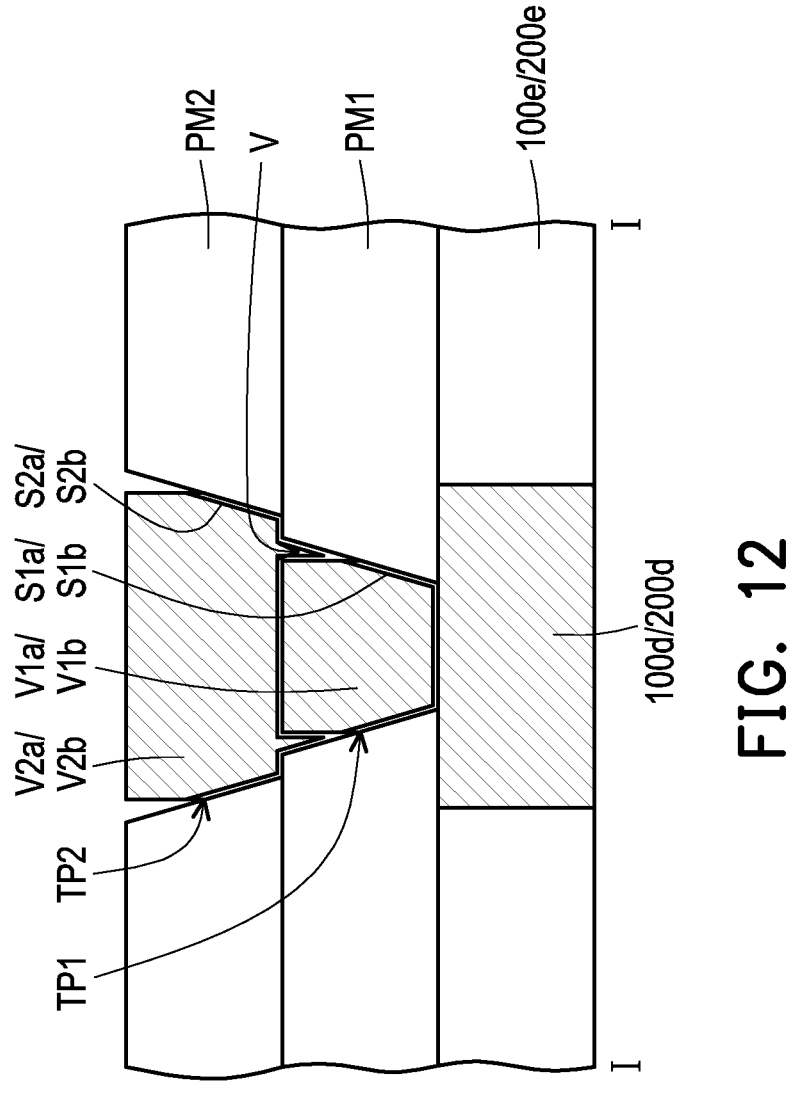
Figure 13:
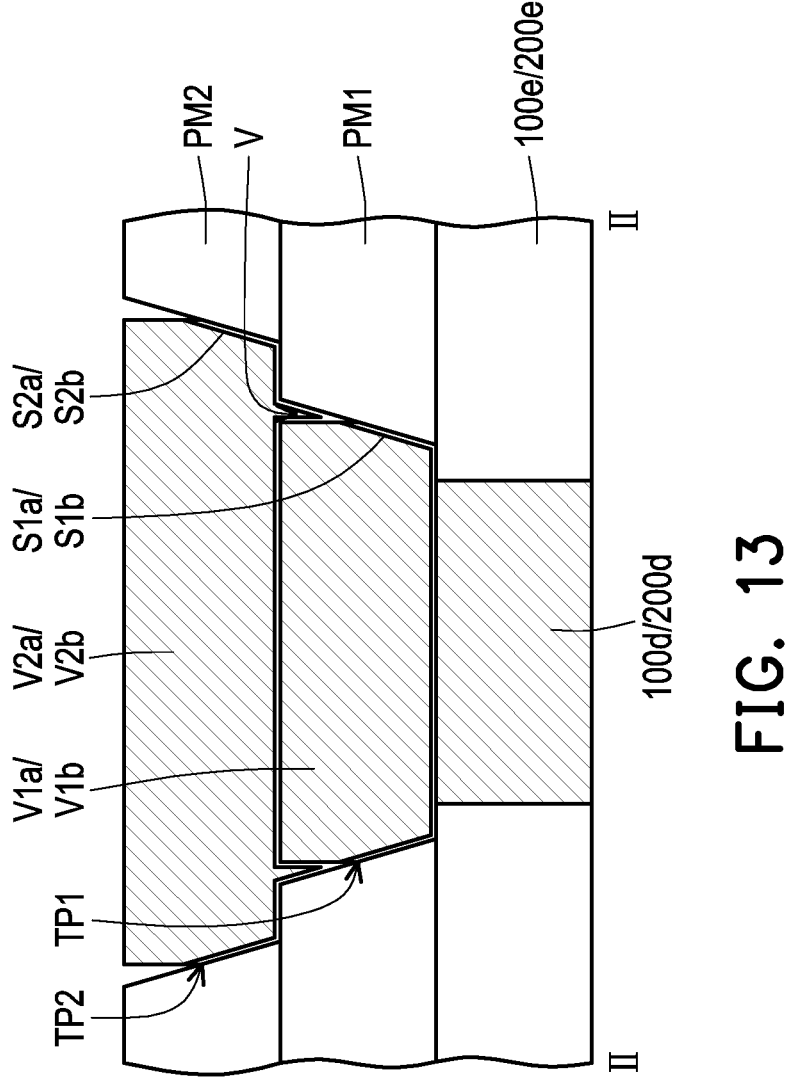

Referring to FIG. 7 and FIG. 12 to FIG. 13, elliptical-like vias V2a/V2b are formed above the V1a/V1b. As shown in the top view of FIG. 7, the vias V2a/V2b have a first length L3 at a semi-major axis and a second length L4 at a semi-minor axis, the first length L3 is greater than the second length L4, and the semi-major axis of the vias V2a/V2b extends along a direction from one die of the dies 100 and 200 towards the facing die of the dies 100 and 200. In some embodiments, the first length L3 of the vias V2a/V2b is greater than the diameter W1/W2 of the die connectors 100d/200d, and the second length L4 of the vias V1a/V1b is smaller than the diameter W1/W2 of the die connectors 100d/200d. In some embodiments, the first length L3 of the vias V2a/V2b is greater than the first length L1 of the vias V1a/V1b, and the second length L4 of the vias V1a/V1b is greater than the second length L2 of the vias V1a/V1b. However, the present disclosure is not limited thereto. In other embodiments, at least one of the first length L3 and the second length L4 of the vias V2a/V2b is no more than (e.g., equal to or less than) the W1/W2 of the die connectors 100d/200d. In some embodiments, the via V2a is part of stacking vias, so a routing line may not be necessary to provide on the via V2a. In some embodiments, the vias V2b are part of the die-to-die interconnection, so a line L2b is provided on the vias V2b for the die-to-die interconnection. In some embodiments, the via V2b on the corresponding die connector 100d has a main part MP21 and at least one tapered part TP21 protruding outward and tapering from the main part MP21 to the routing trace or the line L2b. In some embodiments, the via V2b on the corresponding die connector 200d has a main part MP22 and at least one tapered part TP22 protruding outward and tapering from the main part MP22 to the routing trace or the line L2b. The tapered part is referred to as a "neck portion" or "beak portion" in some examples. The via V2b having a main part MP21/MP22 and a tapered part TP21/TP22 is referred to as a "via cap" or "RDL cap" in some examples.

The cross section views of FIG. 12 and FIG. 13 taken along the lines I-I and II-II of FIG. 7 are different due to the shapes of the vias V2a/V2b are elliptical-like. In one cross section as shown in FIG. 12, the bottom width of the vias V2a/V2b is less than the diameter W1/W2 of the die connectors 100d/200d but greater than the top width of the vias V1a/V1b. In another cross section as shown in FIG. 13, the bottom width of the vias V2a/V2b is greater than both of the diameter W1/W2 of the die connectors 100d/200d and the top width of the vias V1a/V1b, and is in contact with the polymer layer PM2. The sizes or dimensions (e.g., first or second lengths) of the vias V2a/V2b on each of the dies 100 and 200 may be the same or different.

The method of forming the vias V2a/V2b includes the following operations. A seed layer is conformally formed on the top surface of the polymer layer PM2 and on the sidewall and bottom of the opening in the polymer layer PM2. In some embodiments, for fine-pitch purpose, a photoresist layer (not shown) with a line opening is formed on the seed layer, and the line opening exposes the lower portion of the opening while covers the upper portion of the opening in the polymer layer PM2. The vias V2a/V2b and the lines L2b (not shown in this cross section) are plated from the seed layer. The photoresist layer and the underlying seed layer are removed. The remaining seed layer S2a/S2b is provided between the corresponding via V2a/V2b and the polymer layer PM2. In certain embodiment, the top surface of the via V2a/V2b may be substantially flushed with the top surface of the polymer layer PM2, and voids may be present between the via V2a/V2b and the polymer layer PM2, as shown in FIG. 12 and FIG. 13. From another point of view, the sidewall of the via V1a/V1b may have a turning point TP2, as shown in FIG. 12 and FIG. 13. In certain embodiment, the bottom of the via V2a/V2b may be uneven and the seed layer S2a/S2b and the via V2a/V2b may fill the voids V between the via V1a/V1b and the polymer layer PM2.

However, the present disclosure is not limited thereto. In some embodiments, the via V2a/V2b completely fills the opening of the polymer layer PM2, without leaving a void between the sidewall of the via V2a/V2b and the polymer layer PM2, and the top surface of the via V2a/V2b is flushed with or slightly higher than the top surface of the polymer layer PM2.

In other embodiments, when the footprint area is still enough, the photoresist layer may be formed to expose the entire opening of the polymer layer PM2, so the top surface of the formed via V2a/V2b may be higher than the top surface of the polymer layer PM2 and may partially cover the top surface of the polymer layer PM2, as shown in FIG. 4. In some embodiments, the bottom of the via V2a/V2b may be even and planar, and the via V2a/V2b is landed on the top surface of the via V1a/V1b PM1, as shown in FIG. 4.

In some embodiments, the upper vias V3a/V3b may have a shape similar to the shape of the lower vias V1a/V1b and V2a/V2b. For example, the upper vias V3a/V3b may be elliptical-like and have first and second lengths greater than those of the lower vias V2a/V2b. In other embodiments, the upper vias V3a/V3b may have a shape different from the shape of the lower vias V1a/V1b and V2a/V2b. For example, the upper vias V3a/V3b may be circle-like and have a diameter greater than at least one of the first and second lengths of the lower vias V2a/V2b. The dimension of the upper vias V3a/V3b may be different from (e.g., greater than) the dimension of the lower vias V2a/V2b.

FIG. 14 to FIG. 18 are simplified top views illustrating various arrangements of the vias/connectors of various semiconductor packages according to some embodiments of the present disclosure. For simplicity and clarity, only die connectors of dies and vias of the redistribution layer structure are shown.

Figure 14:
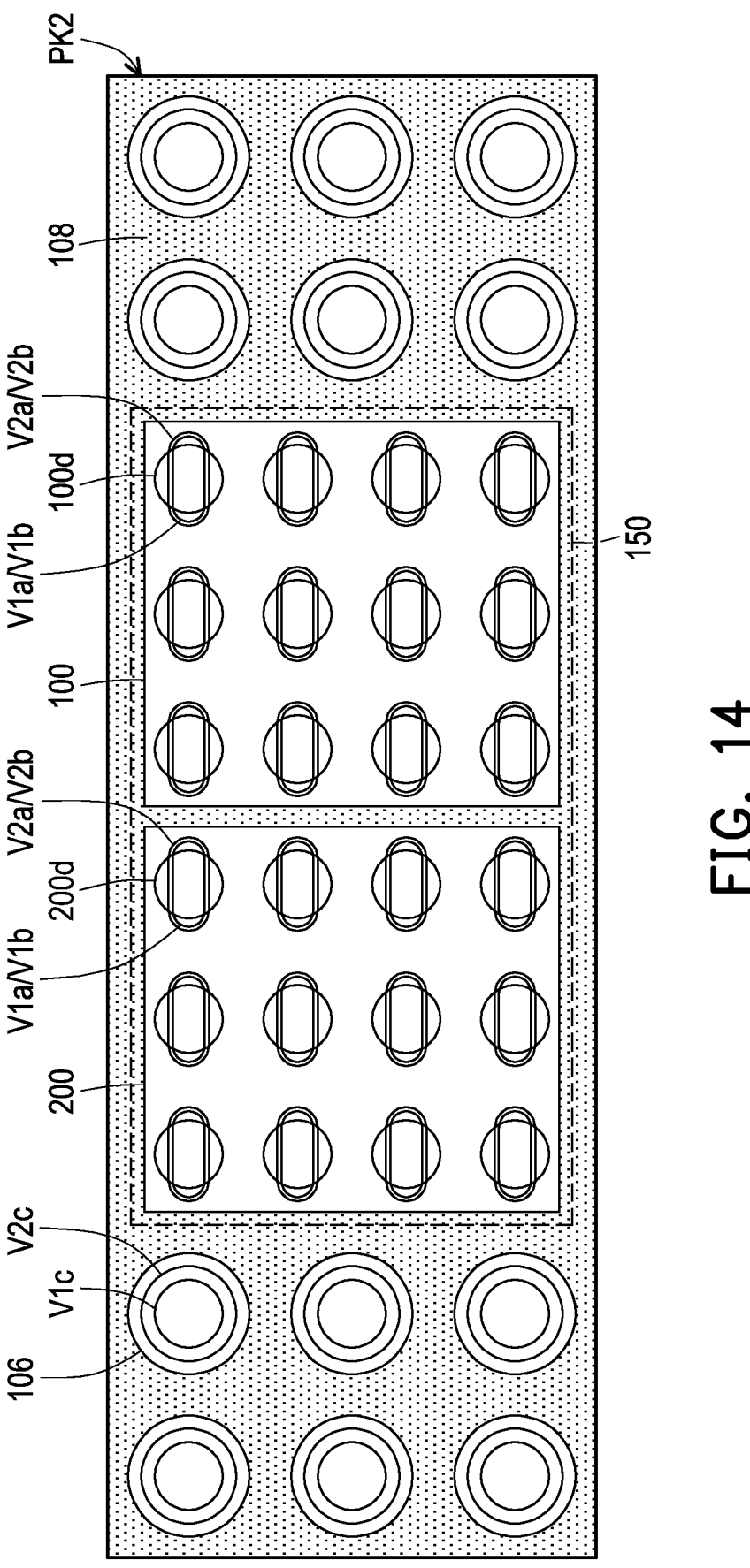
FIG. 14 to FIG. 18 are simplified top views illustrating various arrangements of the vias/connectors of various semiconductor packages according to some embodiments of the present disclosure.

Referring to FIG. 14, in the semiconductor package PK2, dies 100 and 200 are disposed in the chip region 150. In some embodiments, the chip region 150 is defined as a region including all the chips and a periphery of the chip region 150 is along all the edges of the outermost chips. The die 100 has circle-like die connectors 100d arranged in an array, and the die 200 has circle-like die connectors 200d arranged in an array. The oval-like vias V1a/V1b and V2a/V2b are disposed over the corresponding die connectors 100d and 200b. The oval-like vias V1a/V1b and V2a/V2b are directional. In some embodiments, the oval-like vias V1a/V1b and V2a/V2b are parallel to each other. For example, the semi-major axis of the vias V1a/V1b and V2a/V2b on the die 100 is parallel to the semi-major axis of the vias V1a/V1b and V2a/V2b on the die 200. Such directional arrangements of the vias V1a/V1b and V2a/V2b are beneficial for fine-pitch design and effective die-to-die talk. In some embodiments, the vias V1a/V1b and V2a/V2b within the chip region 150 are elliptical-like, while the vias V1c/V2c outside of the chip region 150 are circle-like. In some embodiments, from a top view, the V1a/V1b and V2a/V2b extend beyond the corresponding die connectors 100d/200d, and the vias V1c/V2c fall within the boundaries of the corresponding through dielectric vias 106.

Figure 15:
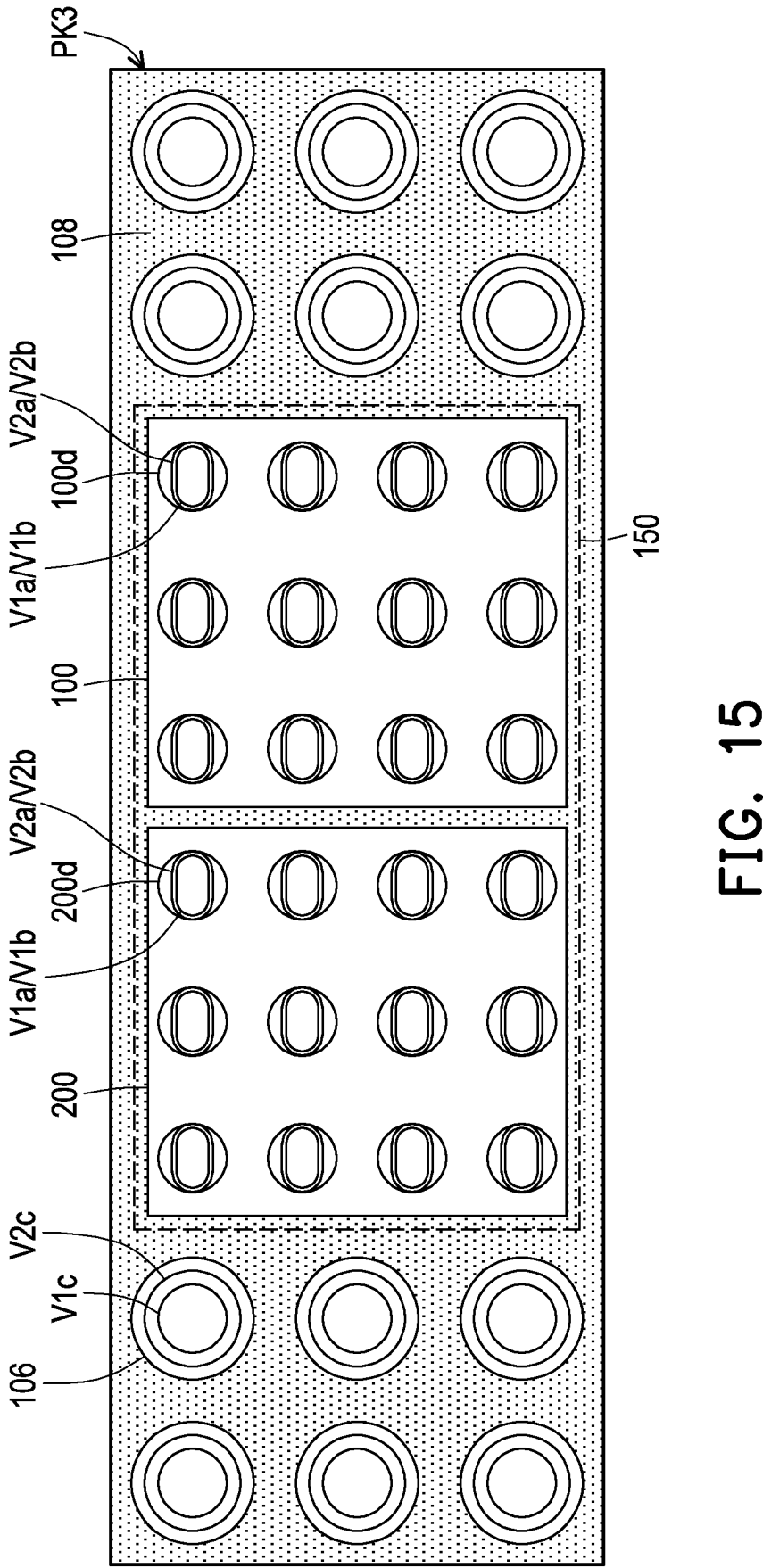

The semiconductor package PK3 of FIG. 15 is similar to the semiconductor package PK2 of FIG. 14, so the difference between them is illustrated below, and the similarity is not iterated herein. In the semiconductor package PK3 of FIG. 15, from a top view, the vias V1a/V1b and V2a/V2b fall within the boundaries of the corresponding die connectors 100d/200d. Such arrangement are beneficial for fine-pitch design, better resistance performance and effective die-to-die talk.

Figure 16:
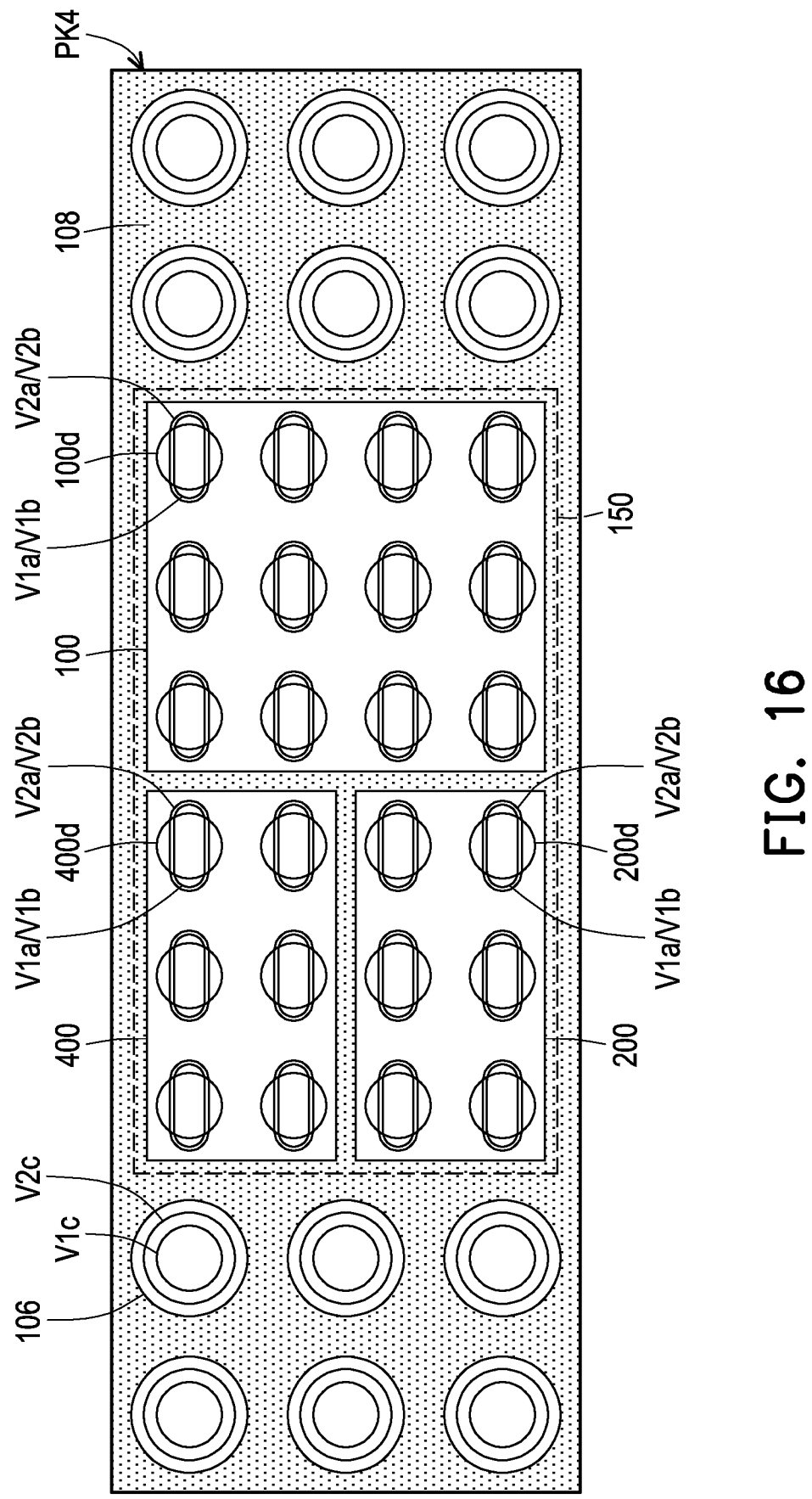

The semiconductor package PK4 of FIG. 16 is similar to the semiconductor package PK2 of FIG. 14, so the difference between them is illustrated below, and the similarity is not iterated herein. In the package PK4 of FIG. 16, from a top view, three dies 100, 200 and 400 are provided in the chip region 150, the dies 200 and 400 are disposed at the same side of the die 100. The die 100 has circle-like die connectors 100d arranged in an array, the die 200 has circle-like die connectors 200d arranged in an array, and the die 400 has circle-like die connectors 400d arranged in an array. The oval-like vias V1a/V1b and V2a/V2b are disposed over the corresponding die connectors 100d and 200d and 400d. The oval-like vias V1a/V1b and V2a/V2b are directional. In some embodiments, the oval-like vias V1a/V1b and V2a/V2b are parallel to each other. For example, the semi-major axis of the vias V1a/V1b and V2a/V2b on the die 100 are parallel to the semi-major axis of the vias V1a/V1b and V2a/V2b on the die 200, and the semi-major axis of the vias V1a/V1b and V2a/V2b on the die 100 are parallel to the semi-major axis of the vias V1a/V1b and V2a/V2b on the die 400. Such directional arrangements of the vias V1a/V1b and V2a/V2b are beneficial for fine-pitch design and effective die-to-die talk between the dies 100 and 200 and between the dies 100 and 400.

Figure 17:
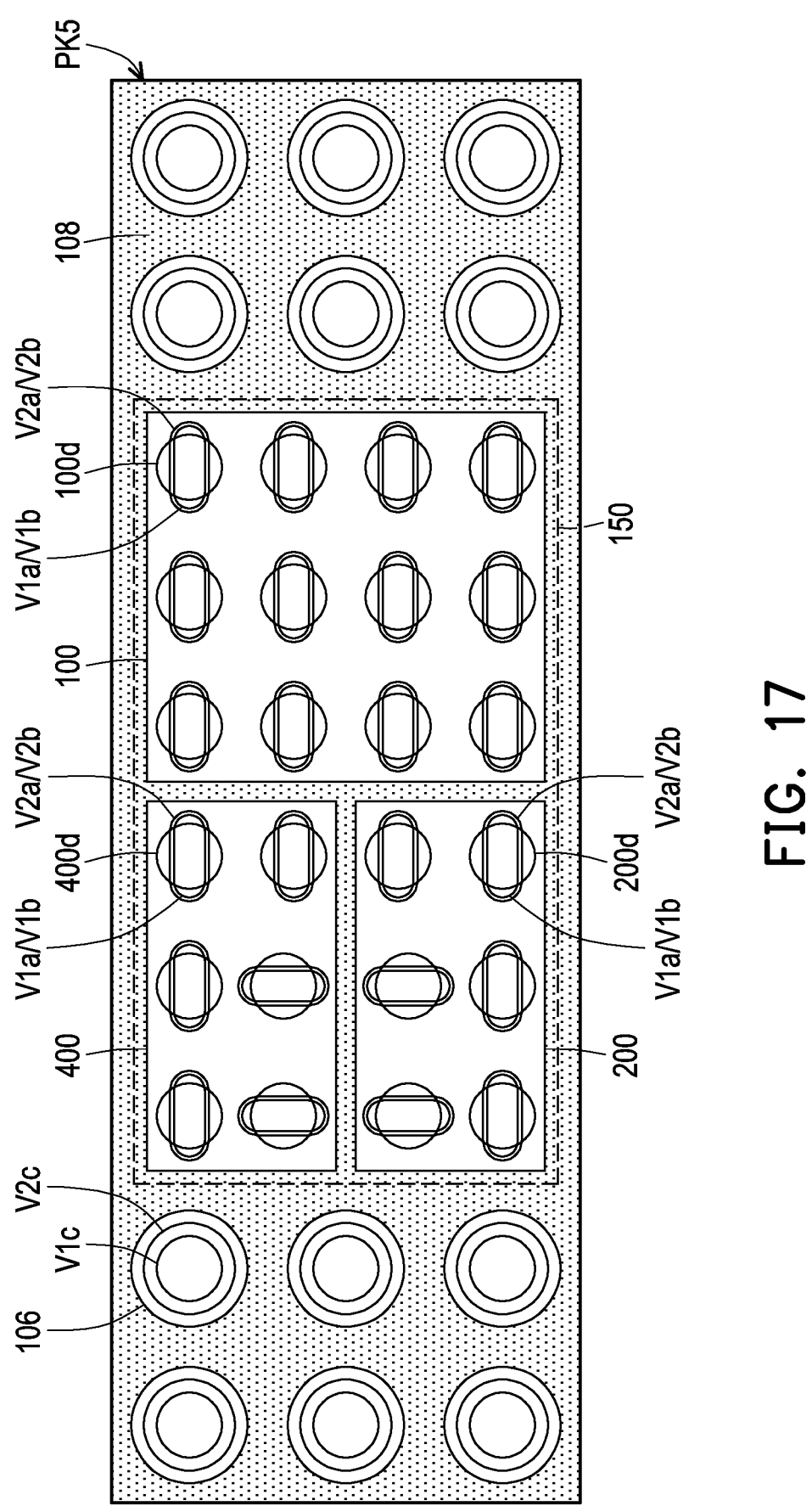

The semiconductor package PK5 of FIG. 17 is similar to the semiconductor package PK4 of FIG. 16, so the difference between them is illustrated below, and the similarity is not iterated herein. In the package PK5 of FIG. 17, from a top view, the vias V1a/V1b and V2a/V2b on the die 100 are directional towards the same direction, while the vias V1a/V1b and V2a/V2b on the dies 200 and 400 are directional towards different directions. In some embodiments, the semi-major axis of some vias V1a/V1b and V2a/V2b on the die 200 is parallel to the semi-major axis of the vias V1a/V1b and V2a/V2b on the die 100, while the semi-major axis of some vias V1a/V1b and V2a/V2b on the die 200 is parallel to the semi-major axis of some vias V1a/V1b and V2a/V2b on the die 400. Similarity, the semi-major axis of some vias V1a/V1b and V2a/V2b on the die 400 is parallel to the semi-major axis of the vias V1a/V1b and V2a/V2b on the die 100, while the semi-major axis of some vias V1a/V1b and V2a/V2b on the die 400 is parallel to the semi-major axis of some vias V1a/V1b and V2a/V2b on the die 200. Such directional arrangements of the vias V1a/V1b and V2a/V2b on the dies 100, 200 and 400 are beneficial for fine-pitch design and effective die-to-die talk between the dies 100 and 200, between the dies 100 and 400 and between the dies 200 and 400.

Figure 18:
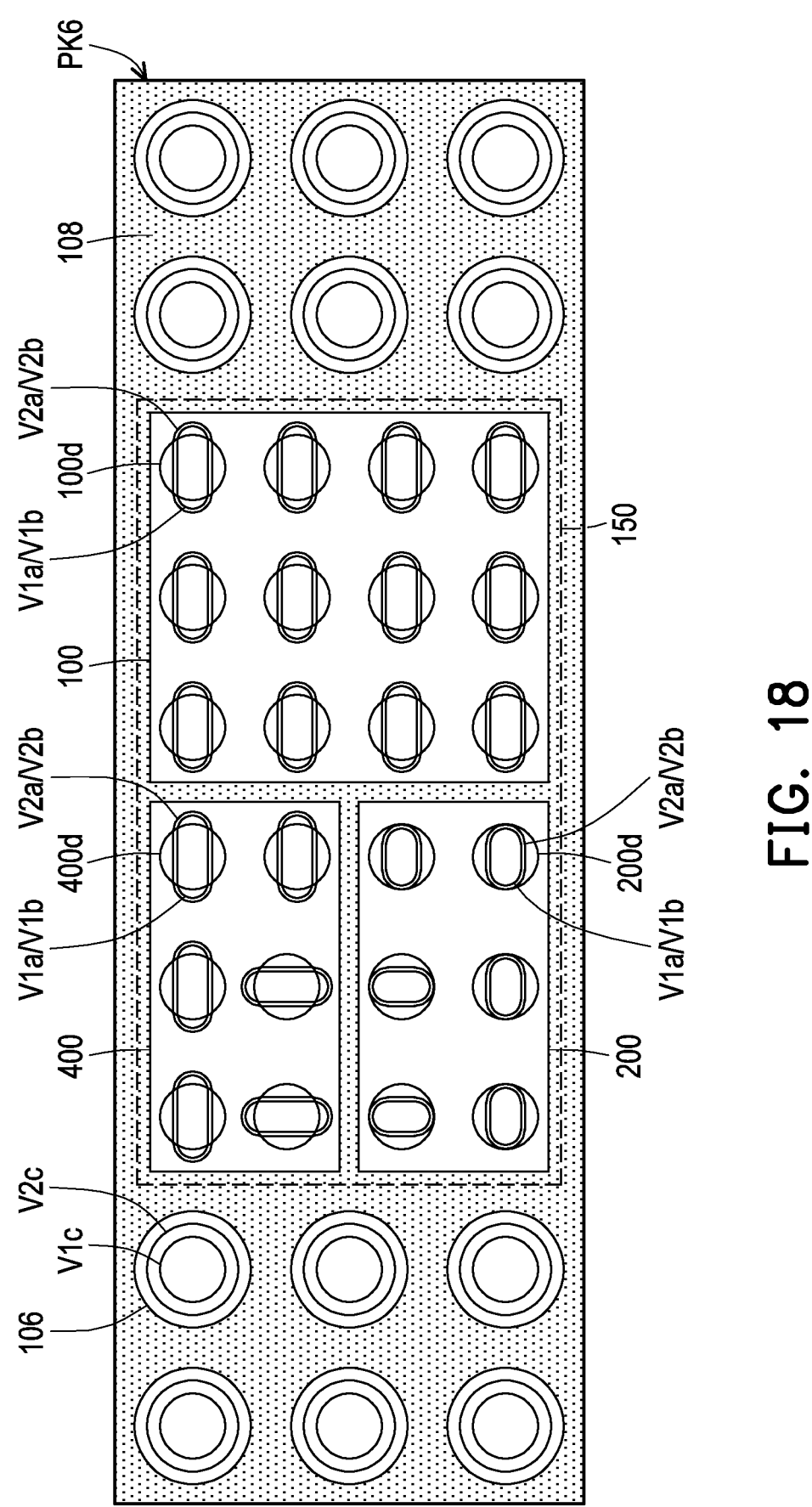

The semiconductor package PK6 of FIG. 18 is similar to the semiconductor package PK5 of FIG. 17, so the difference between them is illustrated below, and the similarity is not iterated herein. In the semiconductor package PK6 of FIG. 18, from a top view, the vias V1a/V1b and V2a/V2b on the die 200 fall within the boundaries of the corresponding die connectors 200d, while the V1a/V1b and V2a/V2b on the dies 100 and 400 extend beyond the corresponding die connectors 100d/400d. Such arrangement are beneficial for fine-pitch design, better resistance performance and effective die-to-die talk.

The arrangements of the vias/connectors of various semiconductor packages in FIG. 14 to FIG. 18 are provided for illustration purposes, and are not construed as limiting the present disclosure. Other arrangements of the vias/connectors of various semiconductor packages are possible. Specifically, oval-like vias of a redistribution layer structure are contemplated as falling within the spirit and scope of the present disclosure, as long as such directional oval-like vias on the dies provide the benefit of improved fine-pitch and better die-to-die talk.

Figure 19:
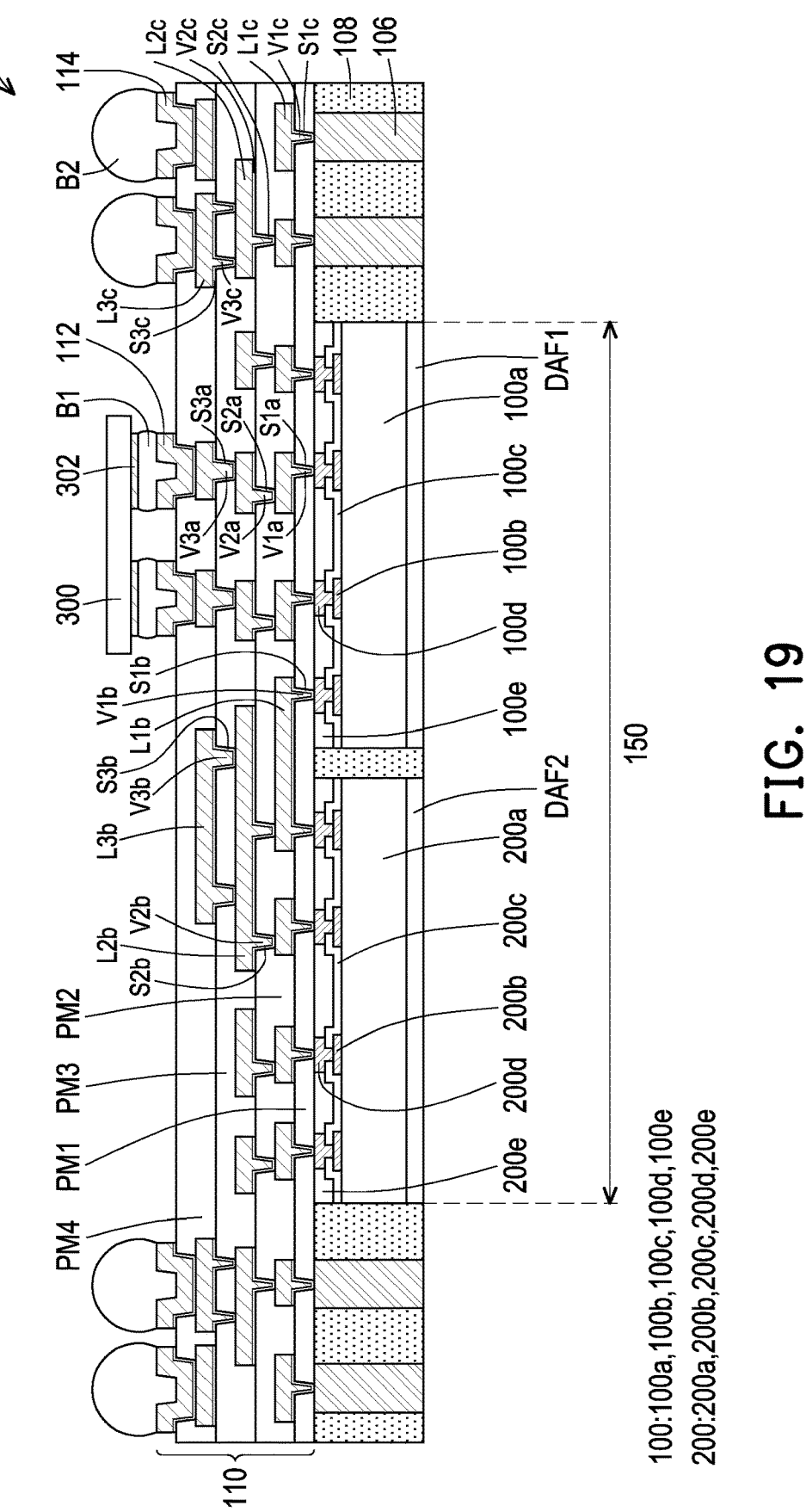
FIG. 19 to FIG. 20 are schematic cross sectional views of different semiconductor packages according to some embodiments of the present disclosure.
Figure 20:
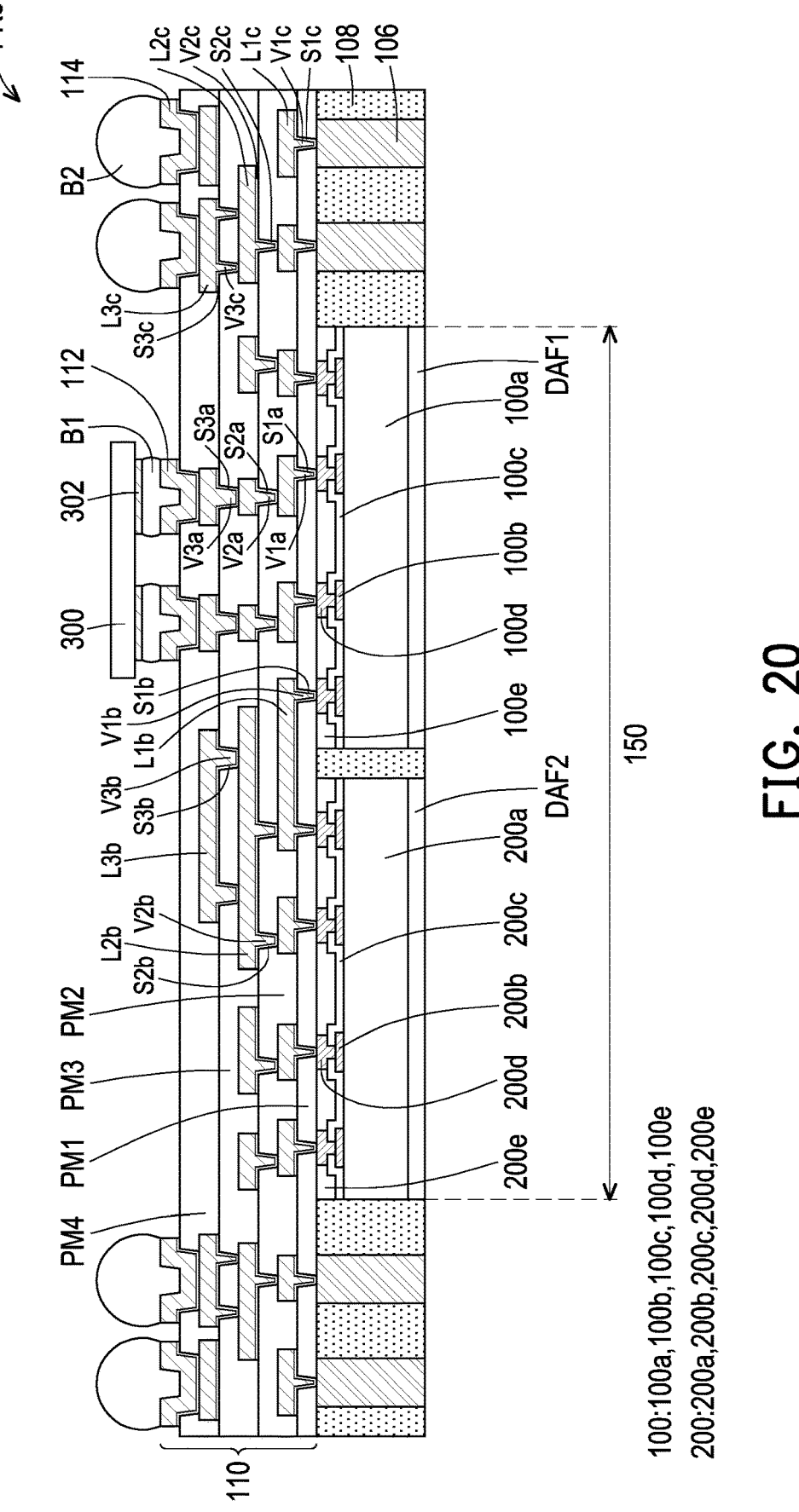

FIG. 19 to FIG. 20 are schematic cross sectional views of different semiconductor packages according to some embodiments of the present disclosure.

Each of the semiconductor package PK7 of FIG. 19 and the semiconductor package PK8 of FIG. 20 is similar to the semiconductor package PK1 of FIG. 4, so the difference between them is illustrated below, and the similarity is not iterated herein.

In the semiconductor package PK1 of FIG. 4, the vias V1a, V2a and V3a are stacking vias, while in the semiconductor package PK7 of FIG. 19, the vias V1a, V2a and V3a are staggered vias in which the adjacent vias are not aligned in a vertical direction. The staggered vias offer good reliability, improve electromigration (EM) performance, and generate less stress in the semiconductor package.

In the semiconductor package PK1 of FIG. 4, the vias V1a, V2a and V3a are stacking vias, while in the semiconductor package PK8 of FIG. 20, the vias V1a, V2a and V3a include combination of stacking vias and staggered vias. Such arrangement provides more flexibility and exhibits improved performance as well.

Besides, the vias V1b/V2b/V3b for the die-to-die interconnection may include stacking vias, staggered vias or a combination thereof, depending on the process requirements.

The semiconductor packages of some embodiments of the present disclosure are illustrated below.

According to some embodiments, a semiconductor package includes a first die 100, a second die 200 and a redistribution layer structure 110. The first die 100 and the second die 200 are disposed laterally. The redistribution layer structure 110 is disposed over and electrically connected to the first die 100 and the second die 200, wherein the redistribution layer structure 110 includes a plurality of vias (e.g., vias V1a/V1b/V1c and V2a/V2b/V2c and V3a/V3b/V3c) and a plurality of lines (e.g., lines L1b/L1c, L2b/L2c, L3b/L3c) stacked alternately and electrically connected to each other and embedded by a plurality of polymer layers (e.g., polymer layers PM1/PM2/PM3/PM4), and wherein from a top view, first vias (e.g. vias V1a/V1b and V2a/V2b) of the plurality of vias overlapping with the first die 100 or the second die 200 have an elliptical-like shape.

In some embodiments, the first vias (e.g. vias V1a/V1b and V2a/V2b) have a first length (e.g., first length L1/L3) at a semi-major axis and a second length (e.g., second length L2/L4) at a semi-minor axis, the first length is greater than the second length, and the semi-major axis of the first vias extends along a direction from the first die 100 towards second die 200, as shown in FIG. 7 and FIG. 14.

In some embodiments, the first die 100 has a plurality of first die connectors 100d electrically connected to the redistribution layer structure 110, and wherein from a top view, the first die connectors 100d have a circle-like shape and have a first diameter W1.

In some embodiments, the first length (e.g., first length L1/L3) of the first vias (e.g. vias V1a/V1b and V2a/V2b) is greater than the diameter W1 of the first die connectors 100d, and the second length (e.g., second length L2/L4) of the first vias (e.g. vias V1a/V1b and V2a/V2b) is smaller than the diameter W1 of the first die connectors 100d, as shown in FIG. 7 and FIG. 14.

In some embodiments, both of the first length and the second length of the first vias are no more than the diameter of the first die connectors 100d, as shown in FIG. 15.

In some embodiments, the first vias (e.g. vias V1a/V1b and V2a/V2b) are elongated towards an extending direction of the adjacent lines (e.g. lines L1b/L2b), as shown in FIG. 7.

In some embodiments, some of the first vias (e.g. vias V1a/V1b or V2a/V2b) are arranged parallel to each other and located at substantially the same level.

In some embodiments, some of the first vias (e.g. vias V1a/V2a or V1b/V2b) are arranged parallel to each other and located at different levels.

In some embodiments, the first vias are stacking vias (e.g. vias V1a/V2a) electrically connected to an integrated device 300 on the redistribution layer structure 100, as shown in FIG. 4.

In some embodiments, the first vias (e.g. vias V1a/V2a) are staggered vias electrically connected to an integrated device 300 on the redistribution layer structure 100, as shown in FIG. 19.

In some embodiments, the first vias include stacking vias and staggered vias electrically connected to an integrated device 300 on the redistribution layer structure 110, as shown in FIG. 20.

In some embodiments, from a top view, second vias (e.g., vias V1c/V2c) of the plurality of vias non-overlapping with the first die 100 or the second die 200 have a circle-like shape, as shown in FIG. 14.

According to some embodiments, a semiconductor package includes a first die 100, a second die 200, a dielectric encapsulation layer 108, a plurality of first vias (e.g., vias V1a/V1b) and a first polymer layer PM1. The first die 100 includes a plurality of first die connectors 100d and a first protection layer 100e around the first die connectors 100d. The second die 200 is disposed aside the first die 100 and includes a plurality of second die connectors 200d and a second protection layer 200e around the second die connectors 200d. The dielectric encapsulation layer 108 encapsulates the first die 100 and the second die 200. The first vias (e.g., vias V1a/V1b) are disposed over and in physical contact with the first die connectors 100d of the first die 100 and the second die connectors 200d of the second die 200. The first polymer layer PM1 surrounds the first vias (e.g., vias V1a/V1b). In some embodiments, the first vias (e.g., vias V1a/V1b) are elongated vias and arranged parallel to each other.

In some embodiments, the first vias (e.g., vias V1a/V1b) have a first length L1 at a semi-major axis and a second length L2 at a semi-minor axis, the first length L1 is greater than the second length L2, and the semi-major axis of the first vias (e.g., vias V1a/V1b) extends along a direction from the first die 100 towards the second die 200, as shown in FIG. 6 and FIG. 14.

In some embodiments, the first length L1 of the first vias (e.g., vias V1a/V1b) is greater than the diameter W1 of the first die connectors 100d, and the second length L2 of the first vias is smaller than the diameter W1 of the first die connectors 100d, as shown in FIG. 6 and FIG. 14.

In some embodiments, both of the first length and the second length of the first vias (e.g., vias V1a/V1b) are no more than the diameter of the first die connectors 100d, as shown in FIG. 15.

In some embodiments, the first vias (e.g., vias V1a/V1b) are in physical contact with the first protection layer 100e of the first die 100, as shown in FIG. 11.

In some embodiments, upper sidewalls of the first vias (e.g., vias V1a/V1b) are separated from the first polymer layer PM1, and lower sidewalls of the first vias (e.g., vias V1a/V1b) are in contact with the first polymer layer PM1, as shown in FIG. 11 and FIG. 12.

In some embodiments, through dielectric vias 106 are further included in the semiconductor package, and the through dielectric vias 106 penetrate through the dielectric encapsulation layer 108 and are located aside the first die 100 and the second die 200.

In some embodiments, second vias (e.g., vias V1c) are further included in the semiconductor package, and the second vias (e.g., vias V1c) are disposed over and in physical contact with the through dielectric vias 106, wherein a diameter of the second vias (e.g., vias V1c) is less than a diameter of the through dielectric vias 106, as shown in FIG. 14.

FIG. 21 is a flow chart showing a method of forming a semiconductor package according to some embodiments of the present disclosure. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 500, at least two dies are provided on a carrier within a chip region and through dielectric vias are provided on the carrier outside of the chip region. FIG. 1 illustrates a cross-sectional view corresponding to some embodiments of act 500.

At act 502, a redistribution layer structure is formed over and electrically connected to the dies and the through dielectric vias, wherein forming the redistribution layer structure includes forming first vias (e.g., via V1a/V1b, V2a/V2b) within the chip region and forming second vias (e.g., vias V1c/V2c) outside of the chip region, wherein from a top view, a shape of first vias different from a shape of the second vias. In some embodiments, the first vias (e.g., via V1a/V1b, V2a/V2b) have an elliptical-like shape, and the second vias (e.g., vias V1c/V2c) have a circle-like shape. In some embodiments, the first vias (e.g., via V1a/V1b) and the second vias (e.g. vias V1c) are at substantially the same level. In some embodiments, the first vias (e.g., via V1a/V1b) and the second vias (e.g., vias V2c) are at different levels. FIG. 2, FIG. 6 to FIG. 7, and FIG. 14 to FIG to FIG. 18 illustrate different cross-sectional and top views corresponding to some embodiments of act 502.

At act 504, at least one device and bumps are formed on the redistribution layer structure. FIG. 3 illustrates a cross-sectional view corresponding to some embodiments of act 504.

At act 506, the carrier is removed. FIG. 4 illustrates a cross-sectional view corresponding to some embodiments of act 506.

The above embodiments in which the metal features of the redistribution layer structure is formed by photolithography, plating, and photoresist stripping processes are provided by illustration purpose, and are not construed as limiting the present disclosure. In other embodiments, the metal features of the redistribution layer structure may be formed by a laser direct imaging (LDI) exposure process without a photoresist material.

The present disclosure provides a redistribution layer structure with an ultra-fine pitch. In some embodiments, with the arrangement of the oval-like vias of the present disclosure, the pitch of the routing lines of a redistribution layer can be significantly reduced by more than 50%. Specifically, the semi-major axis of the vias is elongated along the die-to-die interconnection direction, and the semi-minor axis of the vias is shortened to provide space for redistribution layers or routing lines.

According to some embodiments, a semiconductor package includes a first die, a second die and a redistribution layer structure. The first die and the second die are disposed laterally. The redistribution layer structure is disposed over and electrically connected to the first die and the second die, wherein the redistribution layer structure includes a plurality of vias and a plurality of lines stacked alternately and electrically connected to each other and embedded by a plurality of polymer layers, and wherein from a top view, first vias of the plurality of vias overlapping with the first die or the second die have an elliptical-like shape.

According to some embodiments, a semiconductor package includes a first die, a second die, a dielectric encapsulation layer, a plurality of first vias and a first polymer layer. The first die includes a plurality of first die connectors and a first protection layer around the first die connectors. The second die is disposed aside the first die and includes a plurality of second die connectors and a second protection layer around the second die connectors. The dielectric encapsulation layer encapsulates the first die and the second die. The first vias are disposed over and in physical contact with the first die connectors of the first die and the second die connectors of the second die. The first polymer layer surrounds the first vias. In some embodiments, the first vias are elongated vias and arranged parallel to each other.

According to some embodiments, a method of forming a semiconductor package includes following operation. At least two dies are provided on a carrier within a chip region and through dielectric vias are provided on the carrier outside of the chip region. A redistribution layer structure is formed over and electrically connected to the dies and the through dielectric vias, wherein forming the redistribution layer structure includes forming first vias within the chip region and forming second vias outside of the chip region, wherein from a top view, a shape of first vias different from a shape of the second vias. At least one device and bumps are formed on the redistribution layer structure. The carrier is removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a first die and a second die disposed laterally; and
   a redistribution layer structure disposed over and electrically connected to the first die and the second die, wherein the redistribution layer structure comprises a plurality of vias and a plurality of lines stacked alternately and electrically connected to each other and embedded by a plurality of polymer layers, and wherein from a top view, first vias of the plurality of vias overlapping with the first die or the second die have an elliptical-like shape, wherein the first vias are embedded by a first polymer layer of the plurality of polymer layers, and a top surface of the first polymer layer is substantially flushed with top surfaces of the first vias, and wherein at least one of the first vias includes an upper sidewall portion and a lower sidewall portion, the upper sidewall portion is separated from the first polymer layer, and the lower sidewall portion is in contact with the first polymer layer.

2. The semiconductor package as claimed in claim 1, wherein the first vias have a first length at a semi-major axis and a second length at a semi-minor axis, the first length is greater than the second length, and the semi-major axis of the first vias extends along a direction from the first die towards the second die.

3. The semiconductor package of claim 2, wherein the first die has a plurality of first die connectors electrically connected to the redistribution layer structure, and wherein from a top view, the first die connectors have a circle-like shape and have a first diameter.

4. The semiconductor package as claimed in claim 3, wherein the first length of the first vias is greater than the diameter of the first die connectors, and the second length of the first vias is smaller than the diameter of the first die connectors.

5. The semiconductor package as claimed in claim 3, wherein both of the first length and the second length of the first vias are no more than the diameter of the first die connectors.

6. The semiconductor package as claimed in claim 1, wherein the first vias are elongated towards an extending direction of the adjacent lines.

7. The semiconductor package of claim 1, wherein some of the first vias are arranged parallel to each other and located at substantially the same level.

8. The semiconductor package of claim 1, wherein some of the first vias are arranged parallel to each other and located at different levels.

9. The semiconductor package as claimed in claim 1, wherein the first vias are stacking vias electrically connected to an integrated device on the redistribution layer structure.

10. The semiconductor package as claimed in claim 1, wherein the first vias are staggered vias electrically connected to an integrated device on the redistribution layer structure.

11. The semiconductor package as claimed in claim 1, wherein from a top view, second vias of the plurality of vias non-overlapping with the first die or the second die have a circle-like shape.

12. A semiconductor package, comprising:
a first die comprising a plurality of first die connectors and a first protection layer around the first die connectors;
a second die disposed aside the first die and comprising a plurality of second die connectors and a second protection layer around the second die connectors;
a dielectric encapsulation layer encapsulating the first die and the second die;
a plurality of first vias disposed over and in physical contact with the first die connectors of the first die and the second die connectors of the second die; and
a first polymer layer surrounding the first vias, wherein the first vias are elongated vias and arranged parallel to each other, and wherein a top surface of the first polymer layer is substantially flushed with top surfaces of the first vias, and wherein at least one of the first vias includes an upper sidewall portion and a lower sidewall portion, the upper sidewall portion is separated from the first polymer layer, and the lower sidewall portion is in contact with the first polymer layer.

13. The semiconductor package as claimed in claim 12, wherein the first vias have a first length at a semi-major axis and a second length at a semi-minor axis, the first length is greater than the second length, and the semi-major axis of the first vias extends along a direction from the first die towards the second die.

14. The semiconductor package as claimed in claim 13, wherein the first length of the first vias is greater than the diameter of the first die connectors, and the second length of the first vias is smaller than the diameter of the first die connectors.

15. The semiconductor package as claimed in claim 13, wherein both of the first length and the second length of the first vias are no more than the diameter of the first die connectors.

16. The semiconductor package as claimed in claim 12, wherein the first vias are in physical contact with the first protection layer of the first die.

17. The semiconductor package as claimed in claim 12, further comprising a plurality of second vias disposed over and in physical contact with the first vias, wherein a portion of at least one of the second vias extends into an opening between the upper sidewall portion of the at least one first via and the first polymer layer.

18. The semiconductor package as claimed in claim 12, further comprising a plurality of through dielectric vias penetrating through the dielectric encapsulation layer and aside the first die and the second die.

19. The semiconductor package as claimed in claim 18, further comprising a plurality of second vias disposed over and in physical contact with the through dielectric vias, wherein a diameter of the second vias is less than a diameter of the through dielectric vias.

20. A method of forming a semiconductor package, comprising:
providing at least two dies on a carrier within a chip region and providing through dielectric vias on the carrier outside of the chip region;
forming a redistribution layer structure over and electrically connected to the dies and the through dielectric vias, wherein forming the redistribution layer structure comprises forming first vias within the chip region and forming second vias outside of the chip region, wherein from a top view, a shape of first vias different from a shape of the second vias, wherein the first vias are embedded by a first polymer layer of a plurality of polymer layers, and a top surface of the first polymer layer is substantially flushed with top surfaces of the first vias, and wherein at least one of the first vias includes an upper sidewall portion and a lower sidewall portion, the upper sidewall portion is separated from the first polymer layer, and the lower sidewall portion is in contact with the first polymer layer;
forming at least one device and bumps on the redistribution layer structure; and
removing the carrier.

* * * * *